(12) United States Patent
Hamatani et al.

(10) Patent No.: US 8,642,899 B2
(45) Date of Patent: Feb. 4, 2014

(54) TERMINAL STRUCTURE, ELECTRONIC DEVICE, AND MANUFACTURING METHOD THEREOF

(75) Inventors: Toshiji Hamatani, Tochigi (JP); Tomoyuki Aoki, Tochigi (JP); Hiroki Adachi, Tochigi (JP); Hiroyuki Yajima, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 473 days.

(21) Appl. No.: 12/908,518

(22) Filed: Oct. 20, 2010

(65) Prior Publication Data

US 2011/0090656 A1  Apr. 21, 2011

(30) Foreign Application Priority Data

Oct. 21, 2009 (JP) ................... 2009-241992

(51) Int. Cl.
*H05K 1/11* (2006.01)
*H05K 3/10* (2006.01)

(52) U.S. Cl.
USPC ........................................... 174/262; 29/852

(58) Field of Classification Search
USPC ........................ 174/262–266; 361/792–795; 29/852–853
See application file for complete search history.

(56) References Cited

U.S. PATENT DOCUMENTS

| | | |
|---|---|---|
| 5,075,166 A | 12/1991 | Sikorski et al. |
| 5,597,631 A | 1/1997 | Furumoto et al. |
| 5,770,313 A | 6/1998 | Furumoto et al. |
| 5,879,502 A | 3/1999 | Gustafson |
| 5,888,609 A | 3/1999 | Karttunen et al. |
| 6,224,965 B1 | 5/2001 | Haas et al. |
| 6,252,176 B1 * | 6/2001 | Kuramochi et al. ......... 174/255 |
| 6,403,221 B1 | 6/2002 | Nakamura et al. |
| 6,476,330 B2 | 11/2002 | Otsuka et al. |
| 6,482,495 B1 | 11/2002 | Kohama et al. |
| 6,497,991 B1 | 12/2002 | Ishiguro |
| 6,530,147 B1 | 3/2003 | Haas et al. |
| 6,805,958 B2 | 10/2004 | Nakamura et al. |
| 6,926,794 B2 | 8/2005 | Kohama et al. |
| 7,049,178 B2 | 5/2006 | Kim et al. |
| 7,061,083 B1 | 6/2006 | Usami et al. |
| 7,067,392 B2 | 6/2006 | Yamazaki et al. |

(Continued)

FOREIGN PATENT DOCUMENTS

| | | |
|---|---|---|
| EP | 1 092 739 A1 | 4/2001 |
| EP | 1 589 797 A2 | 10/2005 |

(Continued)

*Primary Examiner* — Jeremy Norris
(74) *Attorney, Agent, or Firm* — Nixon Peabody LLP; Jeffrey L. Costellia

(57) ABSTRACT

A method for manufacturing an electronic device comprising a terminal provided with a conductor which penetrates a cured prepreg is provided. At least one opening is formed in the prepreg. The prepreg is attached to a substrate over which an electronic element is formed so that the conductor included in the terminal overlaps with the opening. A conductive paste is provided in a region of the prepreg where the opening is provided. Part of the conductive paste flows into the opening to be in contact with the conductor included in the terminal. Then, heat treatment is performed so that the conductive paste and the prepreg are cured. In the process for manufacturing the terminal, it is not necessary to perform a step of forming an opening with a laser beam after the prepreg is cured. Thus, an adverse effect of a laser beam on the electronic element can be eliminated.

32 Claims, 17 Drawing Sheets

(56) References Cited

U.S. PATENT DOCUMENTS

| | | | |
|---|---|---|---|
| 7,193,308 B2 | 3/2007 | Matsui | |
| 7,465,674 B2 | 12/2008 | Tamura et al. | |
| 7,485,489 B2 | 2/2009 | Björbell | |
| 7,504,317 B2 | 3/2009 | Aoki et al. | |
| 7,510,950 B2 | 3/2009 | Tsurume et al. | |
| 7,564,121 B2 | 7/2009 | Sugimoto | |
| 7,583,512 B2* | 9/2009 | Ryu et al. | 361/765 |
| 7,667,310 B2 | 2/2010 | Dozen et al. | |
| 7,786,576 B2 | 8/2010 | Kodaira | |
| 7,880,091 B2 | 2/2011 | Miyamoto et al. | |
| 8,143,708 B2 | 3/2012 | Oikawa et al. | |
| 8,338,931 B2 | 12/2012 | Dozen et al. | |
| 2004/0016118 A1 | 1/2004 | Haas et al. | |
| 2005/0233122 A1 | 10/2005 | Nishimura et al. | |
| 2006/0029726 A1 | 2/2006 | Mok et al. | |
| 2006/0105153 A1 | 5/2006 | Jang et al. | |
| 2007/0004125 A1 | 1/2007 | Watanabe et al. | |
| 2007/0020932 A1 | 1/2007 | Maruyama et al. | |
| 2007/0069375 A1 | 3/2007 | Sugimoto | |
| 2007/0171992 A1* | 7/2007 | Shameli et al. | 375/257 |
| 2007/0181875 A1 | 8/2007 | Yamazaki et al. | |
| 2007/0235220 A1* | 10/2007 | Shin et al. | 174/262 |
| 2007/0278563 A1 | 12/2007 | Takano et al. | |
| 2008/0012126 A1 | 1/2008 | Dozen et al. | |
| 2008/0044940 A1 | 2/2008 | Watanabe et al. | |
| 2008/0083954 A1 | 4/2008 | Tokunaga | |
| 2008/0224940 A1 | 9/2008 | Sugiyama et al. | |
| 2008/0224941 A1 | 9/2008 | Sugiyama et al. | |
| 2008/0242005 A1 | 10/2008 | Dozen et al. | |
| 2008/0303140 A1 | 12/2008 | Ohtani et al. | |
| 2008/0311706 A1 | 12/2008 | Dozen et al. | |
| 2009/0057875 A1 | 3/2009 | Aoki et al. | |
| 2009/0085182 A1 | 4/2009 | Yamazaki et al. | |
| 2009/0139761 A1* | 6/2009 | Echigo et al. | 174/266 |
| 2009/0289341 A1 | 11/2009 | Yamazaki et al. | |
| 2009/0302455 A1 | 12/2009 | Chida et al. | |
| 2009/0302457 A1 | 12/2009 | Chida et al. | |
| 2009/0314527 A1 | 12/2009 | Hatano et al. | |
| 2010/0171221 A1 | 7/2010 | Chida | |
| 2011/0030212 A1 | 2/2011 | Hamatani et al. | |
| 2011/0032679 A1 | 2/2011 | Baek et al. | |
| 2011/0032684 A1 | 2/2011 | Hamatani et al. | |

FOREIGN PATENT DOCUMENTS

| | | |
|---|---|---|
| JP | 05-190582 | 7/1993 |
| JP | 05-286065 | 11/1993 |
| JP | 07-007246 | 1/1995 |
| JP | 10-092980 | 4/1998 |
| JP | 2001-331120 | 11/2001 |
| JP | 2002-198658 | 7/2002 |
| JP | 2002-290006 | 10/2002 |
| JP | 2003-049388 | 2/2003 |
| JP | 2003-228695 | 8/2003 |
| JP | 2004-362341 | 12/2004 |
| JP | 2007-091822 | 4/2007 |
| JP | 2008-257710 | 10/2008 |
| JP | 2008-262547 | 10/2008 |
| WO | WO 96/09158 A1 | 3/1996 |
| WO | WO 01/01740 A1 | 1/2001 |
| WO | WO 2004/001848 A1 | 12/2003 |
| WO | WO 2008/041716 A1 | 4/2008 |

* cited by examiner

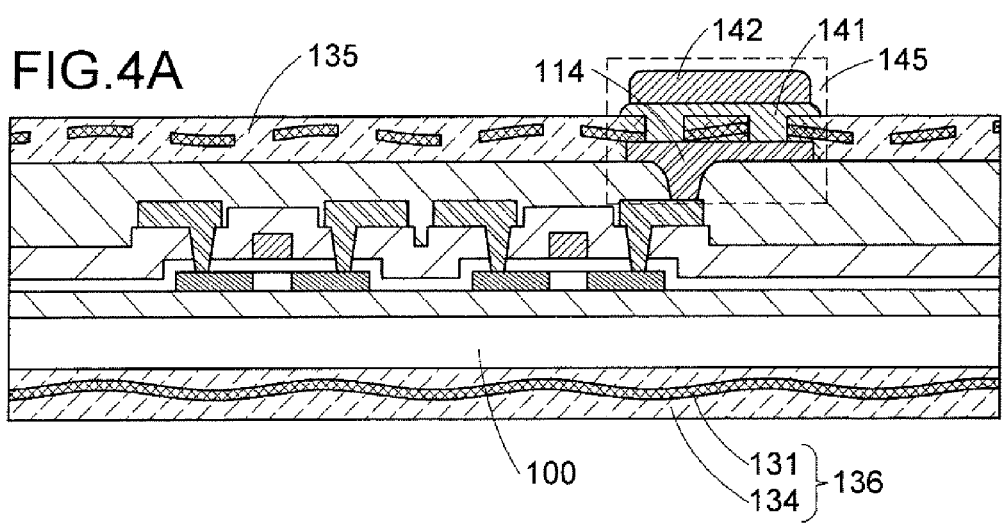
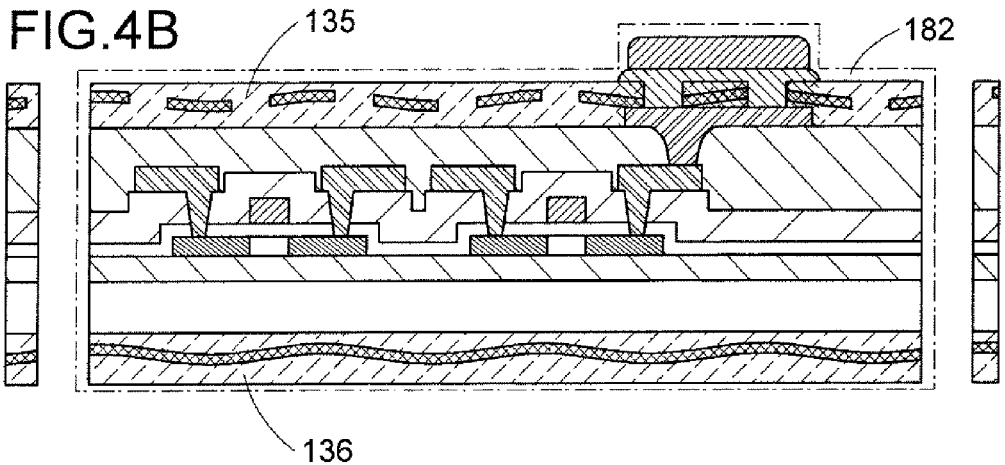

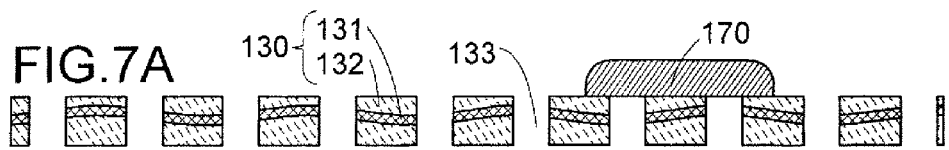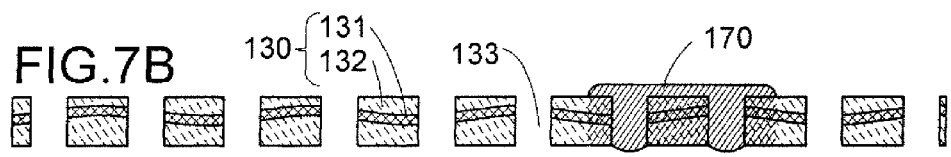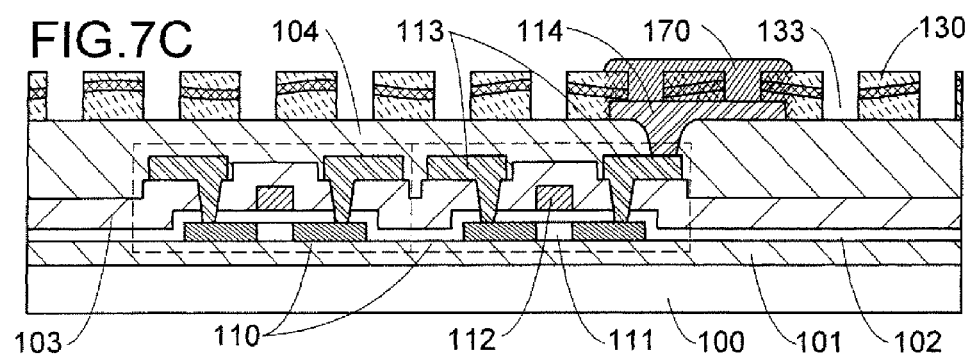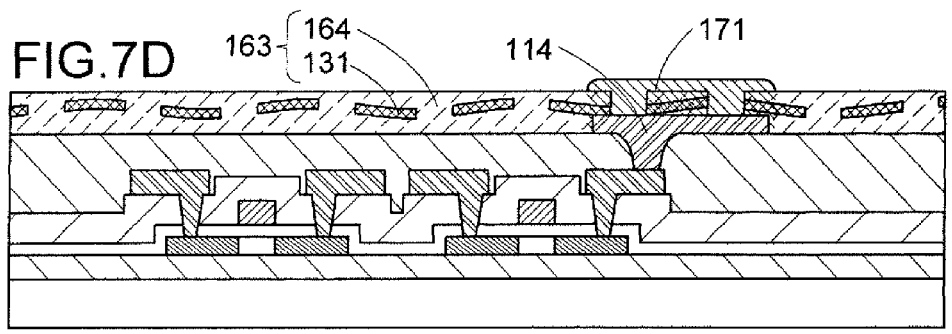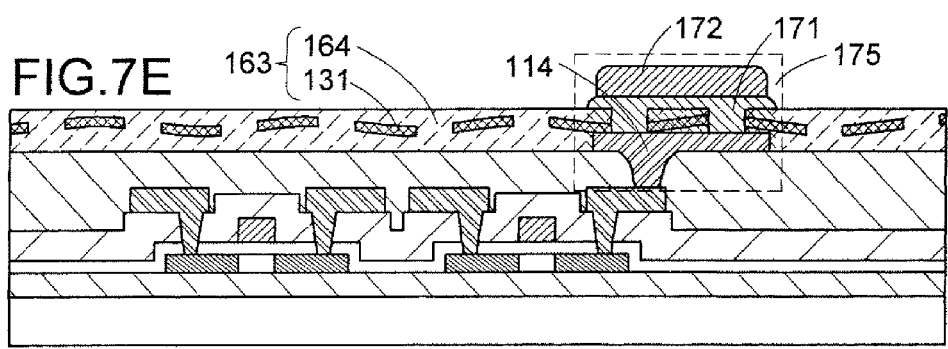

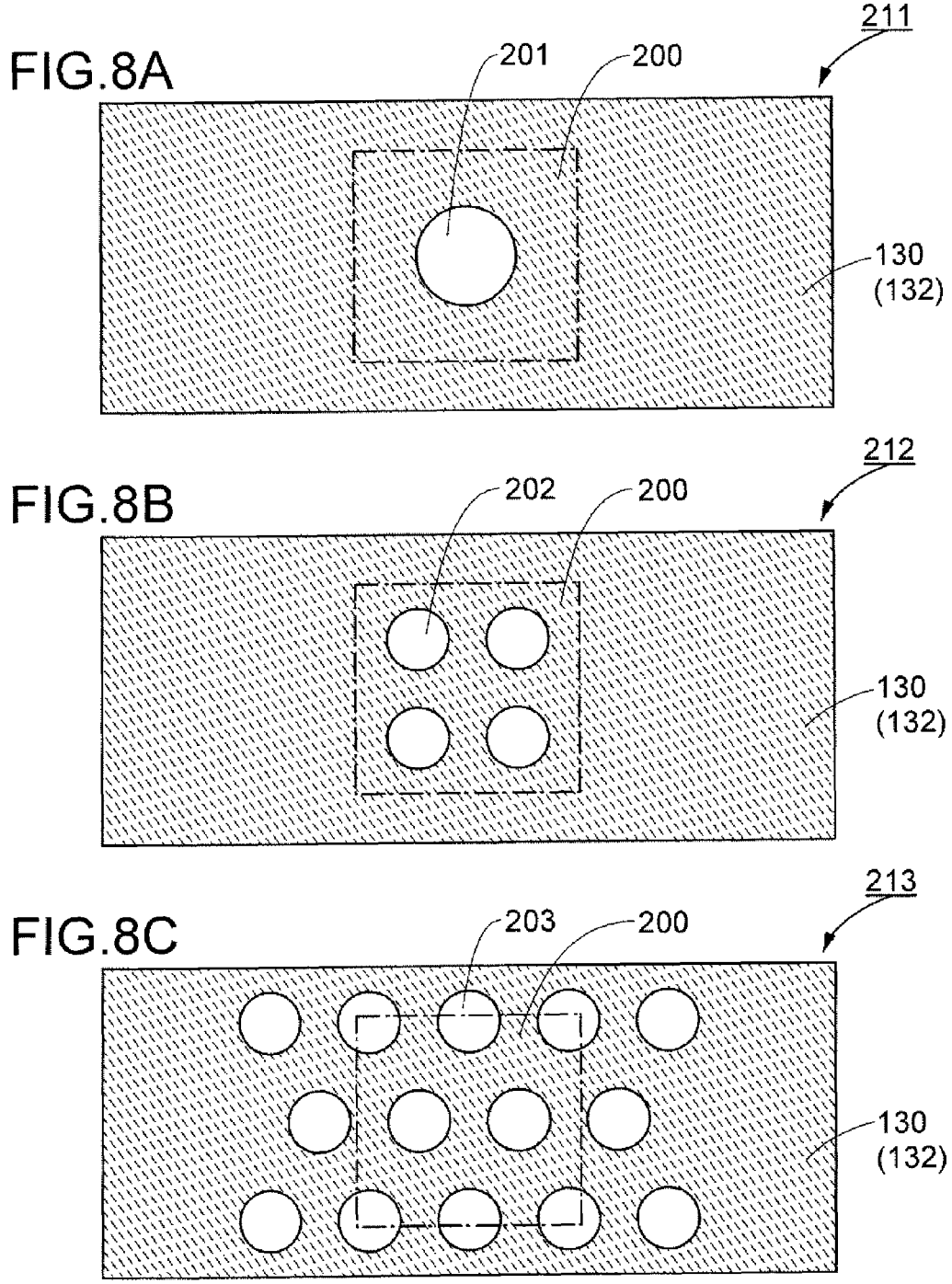

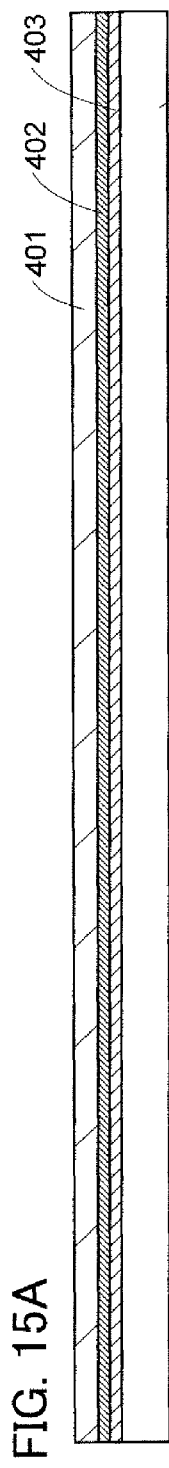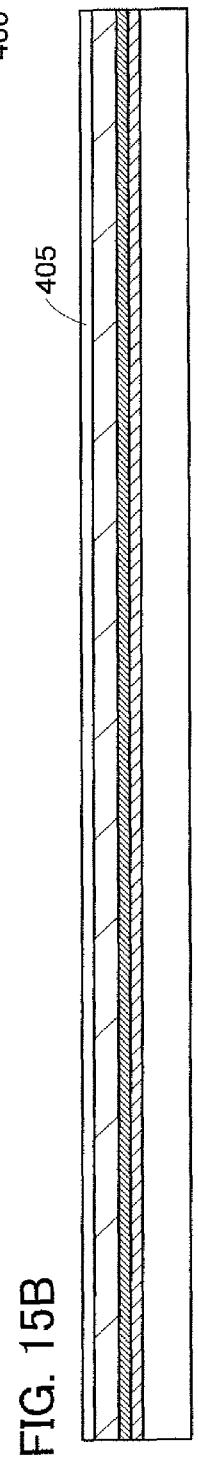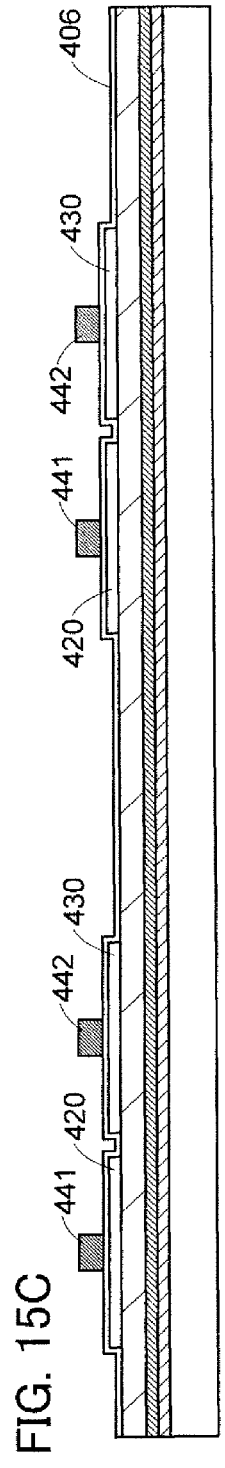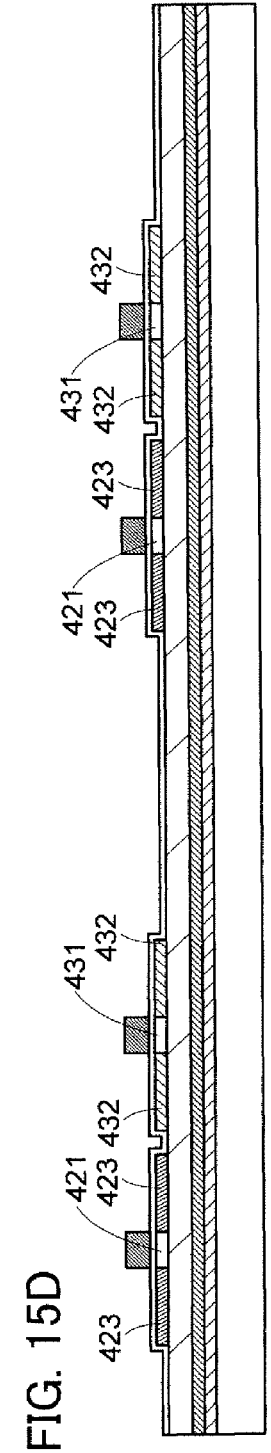

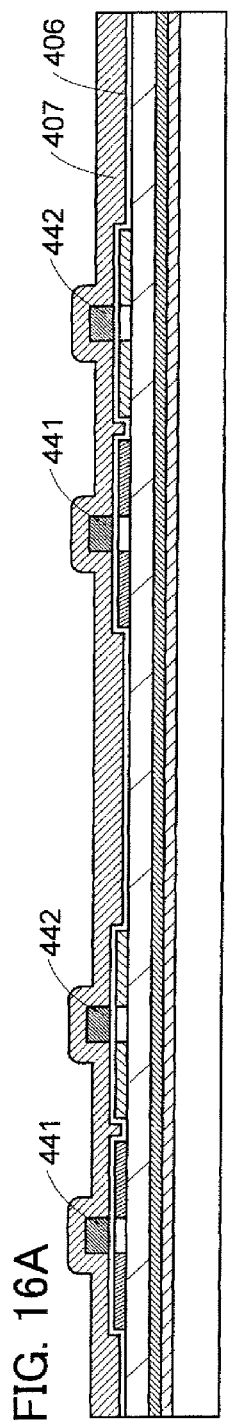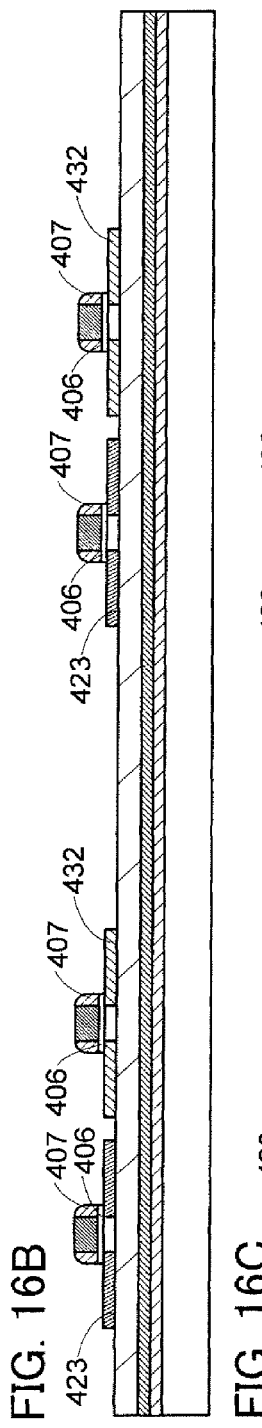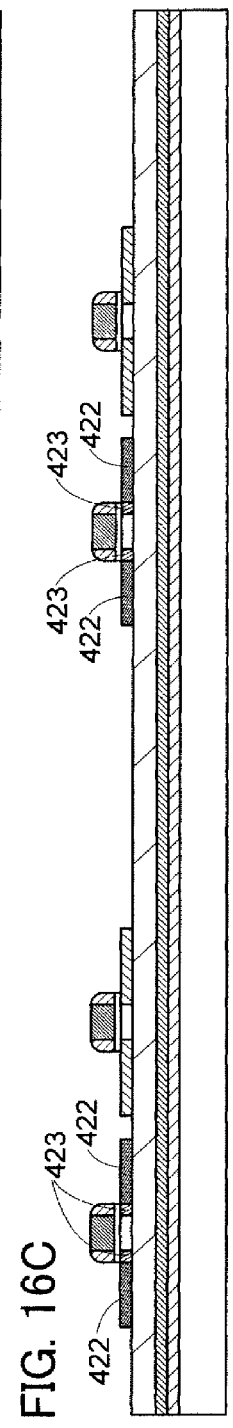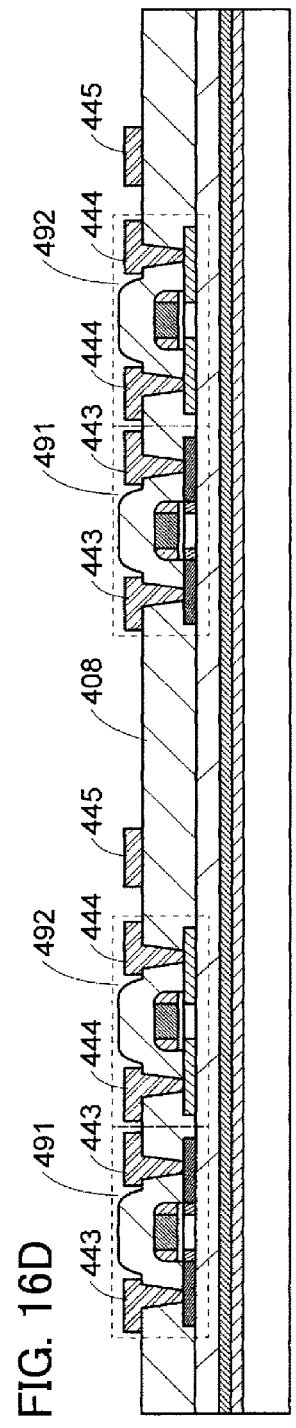

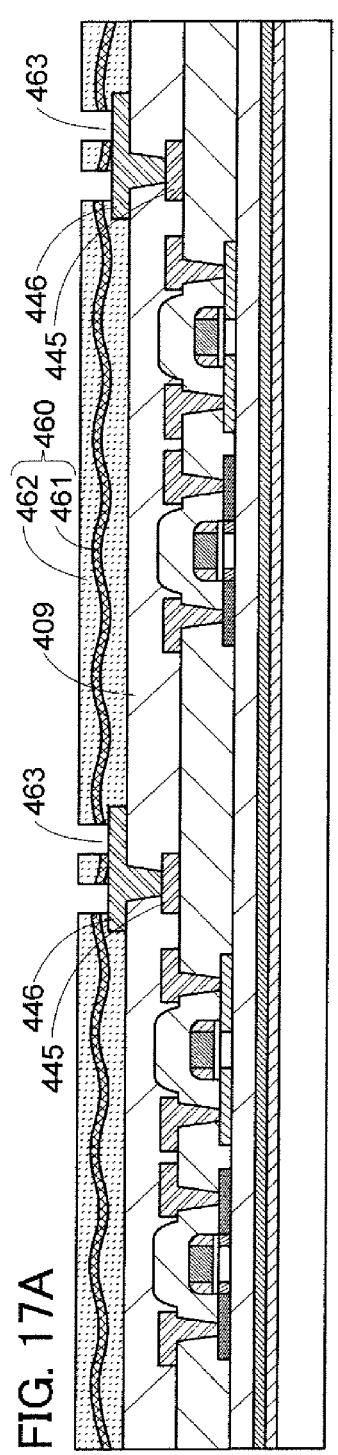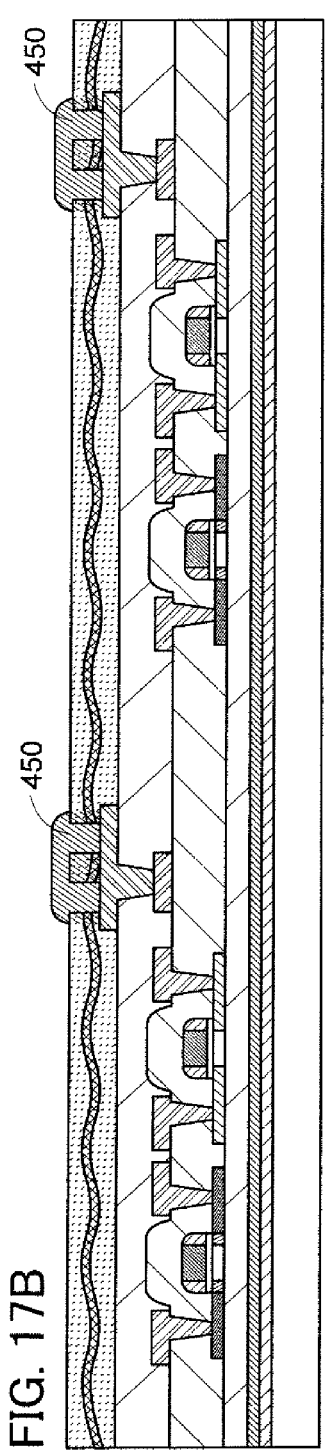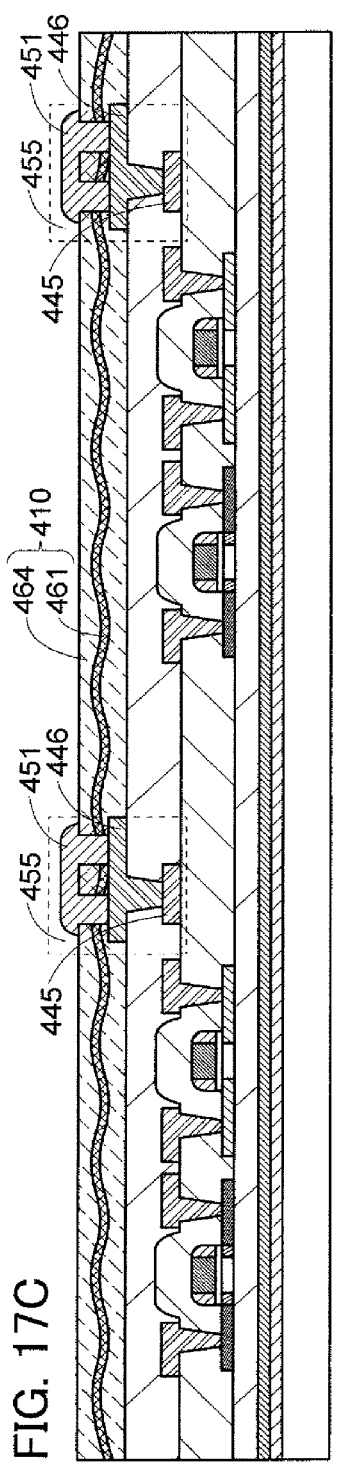

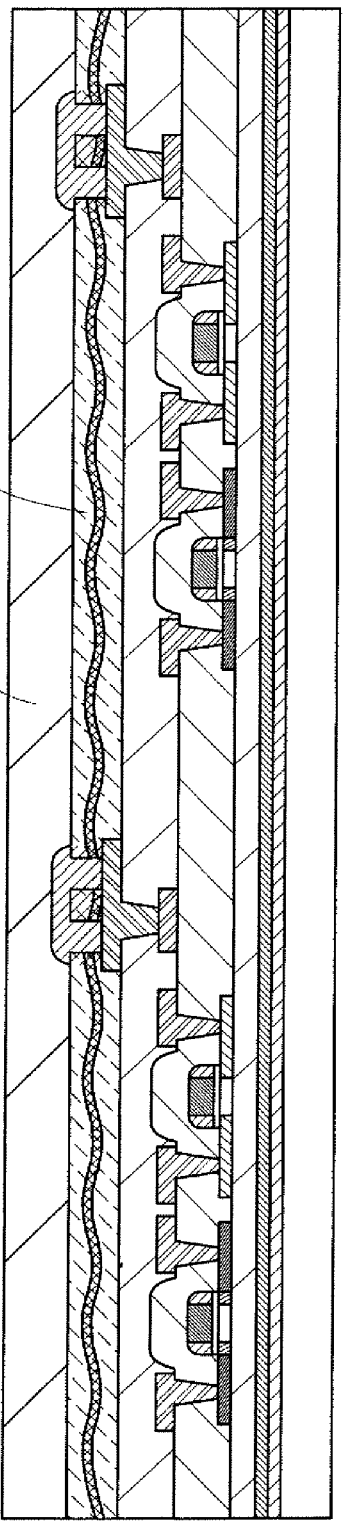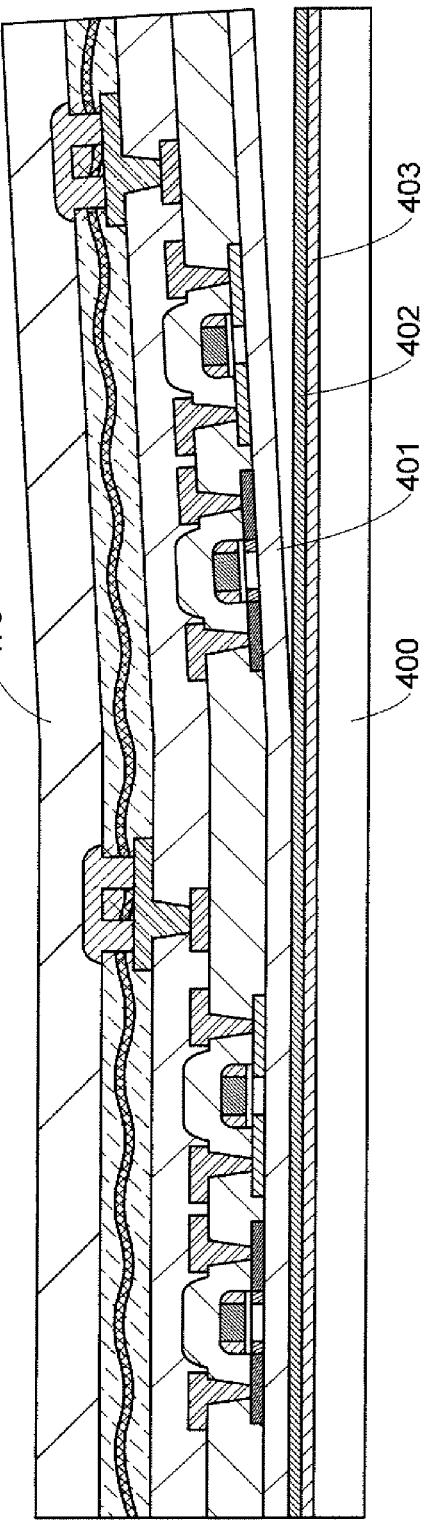
FIG. 18A
FIG. 18B

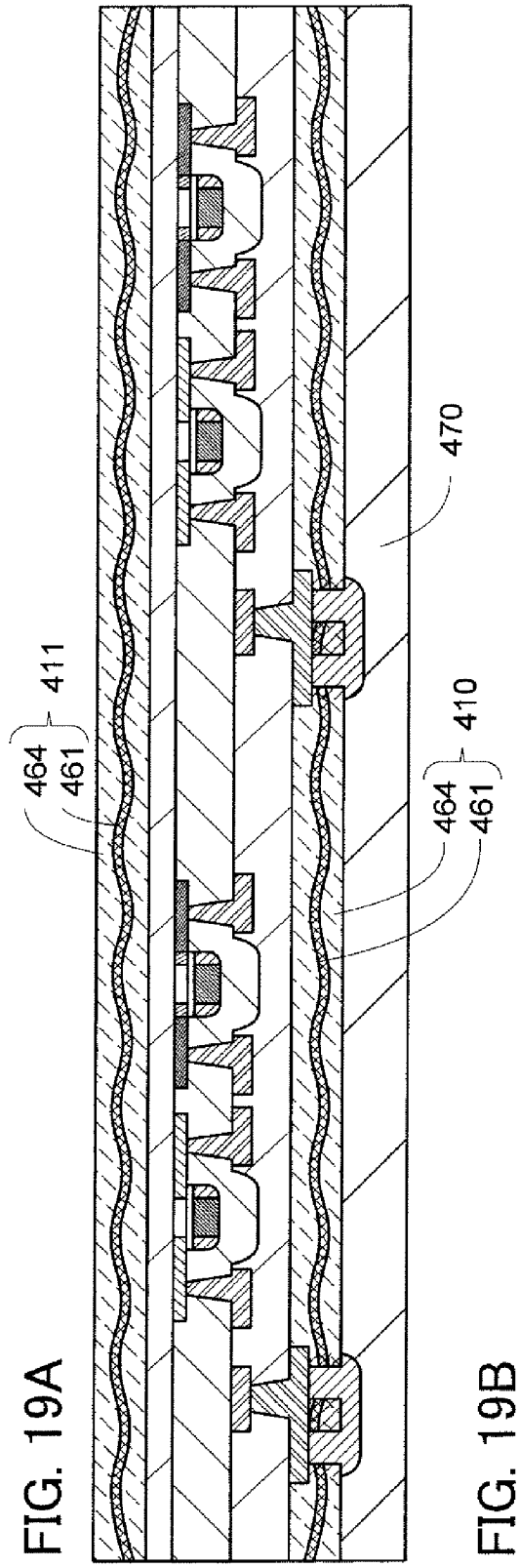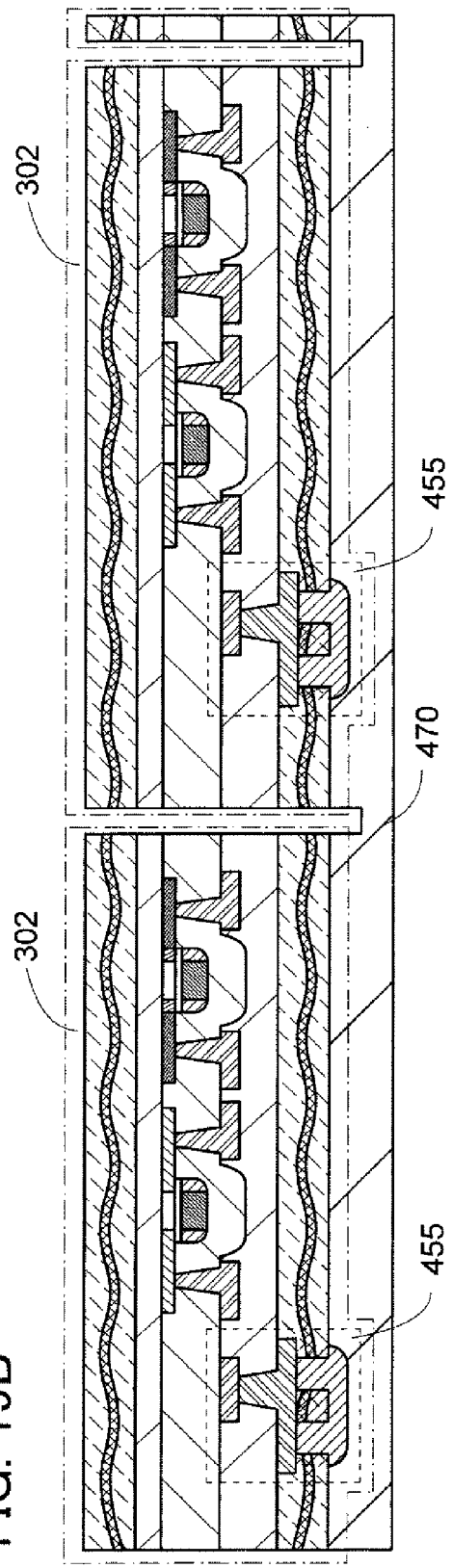

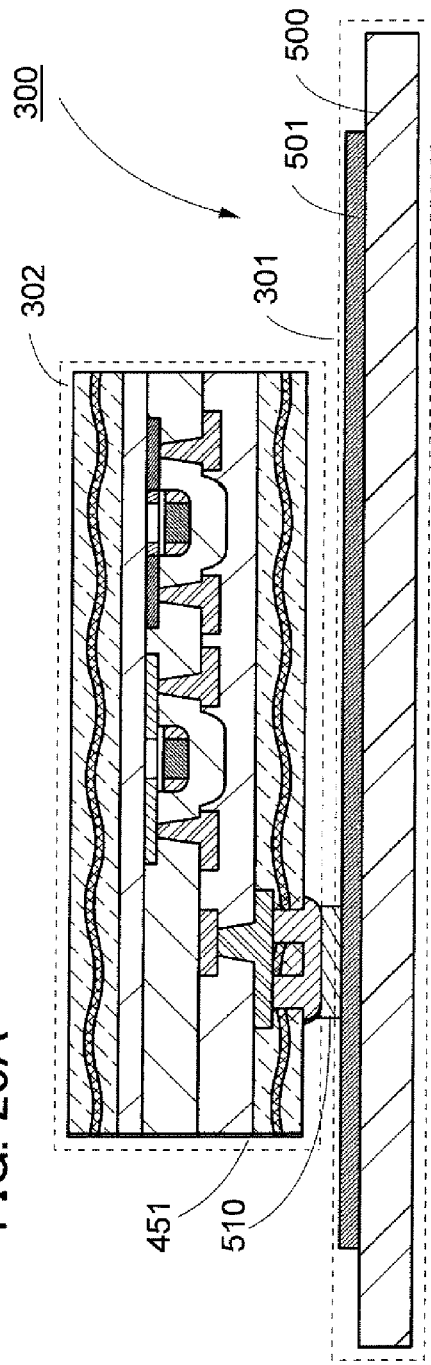
FIG. 20A
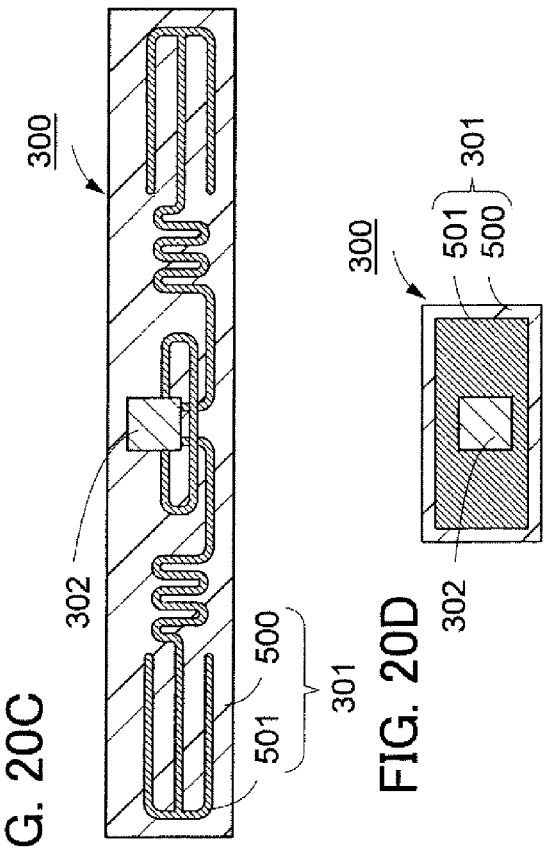
FIG. 20C
FIG. 20D
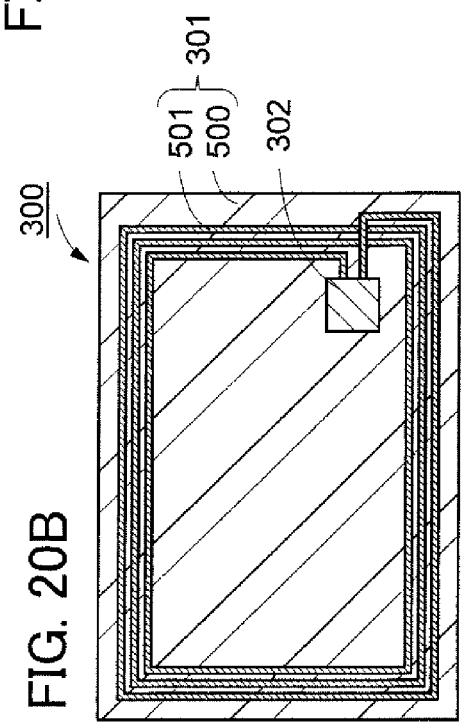
FIG. 20B

TERMINAL STRUCTURE, ELECTRONIC DEVICE, AND MANUFACTURING METHOD THEREOF

BACKGROUND OF THE INVENTION

1. Field of the Invention

In this specification, a terminal structure including a conductor which penetrates an insulating film will be described. Further, an electronic device provided with a terminal having such a structure will be described.

2. Description of the Related Art

A resin layer formed by curing a prepreg is applied to a support, an insulating film, a protective material, or the like of a printed wiring board, an electronic device, or the like (for example, see Patent Documents 1 to 3).

Since a multilayer wiring is formed, an opening for penetrating a resin layer formed from a prepreg is formed in this layer in order to form an electrical connection portion with the outside. For example, Patent Document 1 discloses that an insulating layer of a printed wiring board is formed from a prepreg and an opening is formed in the insulating layer with laser treatment, drilling, or punching-out.

Patent Documents 2 and 3 disclose that an opening is formed in a cured prepreg by performing a step of laser beam irradiation or a photolithography step in order to form a connection terminal for an electronic device sealed with the cured prepreg.

REFERENCE

[Patent Document 1] Japanese Published Patent Application No. 2007-091822
[Patent Document 2] Japanese Published Patent Application No. 2008-257710
[Patent Document 3] Japanese Published Patent Application No. 2008-262547

SUMMARY OF THE INVENTION

As disclosed in Patent Document 1, an opening is formed in a resin film formed from a prepreg by drilling, punching-out, and laser beam treatment. For formation of an opening in a resin film with which an electronic element is sealed, drilling and punching-out are not suitable. Treatment with a laser beam is employed in order not to damage the electronic element.

However, a step of forming an opening with a laser beam takes much time. In addition, in the ease of employing the step of forming an opening with a laser beam, a mechanical impact on an electronic element is small as compared with drill treatment or punching-out; however, the possibility that performance of the electronic element is degraded by energy of a laser beam cannot be completely eliminated. In the study by inventors of the present invention, it is found that characteristics of an electronic element with a small size and a high-performance electronic element driven with low voltage are degraded due to laser beam irradiation in a step of forming an opening in a sealing layer in some cases.

In addition, an opening is formed with a laser beam in a sealing layer with which an electronic element is sealed, dust generated in this step adversely effects the electronic element in some cases.

By using a prepreg including a reinforcing material such as a glass fiber or a glass filler, an electronic element can be sealed with a resin film including the reinforcing material; therefore, the strength of the electronic element can be increased. Meanwhile, in the case where an opening is formed in the sealing film in order to expose an extraction terminal of an electronic element, the reinforcing material is also needed to be removed with the resin film. In the case where an opening is formed with a laser beam, judgment whether both the resin film and the reinforcing material are removed is difficult and needs a skill. Thus, depending on the skill of an operator, the resin film and/or the reinforcing material might be insufficiently removed and thus the areas of regions exposed in openings might vary. Accordingly, the values of connection resistance of two conductors electrically connected through an opening vary, which makes it difficult to manufacture an electric element having electric characteristics with a designed value.

A technical object in this specification is to improve the reliability of a terminal structure including a conductor which penetrates a cured prepreg.

Another technical object in this specification is to provide a method for manufacturing a terminal structure in which an influence of a laser beam is removed as much as possible.

A method for manufacturing a terminal structure and a method for manufacturing an electronic element according to one embodiment of the present invention include the steps of forming a first conductor over a first insulating film; disposing a prepreg having a plurality of openings over the first insulating film so that at least one of the openings overlaps with the first conductor; providing a conductive paste in at least one of the openings which overlaps with the first conductor; and curing the conductive paste and the prepreg by heat treatment, thereby forming a second conductor and a second insulating film.

A method for manufacturing a terminal structure and a method for manufacturing an electronic element according to one embodiment of the present invention include the steps of forming a first conductor over a first insulating film; providing a conductive paste on the first conductor; disposing a prepreg having a plurality of openings over the first insulating film so that at least one of the openings overlaps with the conductive paste; and curing the conductive paste and the prepreg by heat treatment, thereby forming a second conductor and a second insulating film.

A method for manufacturing a terminal structure and a method for manufacturing an electronic element according to one embodiment of the present invention include the steps of forming a first conductor over a first insulating film; providing a conductive paste in at least one of openings formed in a prepreg; disposing the prepreg over the first insulating film so that the at least one of the openings in which the conductive paste is provided overlaps with the first conductor; and curing the conductive paste and the prepreg by heat treatment, thereby forming a second conductor and a second insulating film.

A method for manufacturing a terminal structure and a method for manufacturing an electronic element according to one embodiment of the present invention include the steps of forming a first conductor over a first insulating film; forming one or more openings in a region of a prepreg, which overlaps with the first conductor when the prepreg is disposed over the first insulating film; disposing the prepreg having one or more openings over the first insulating film so that at least one of the openings overlaps with the first conductor; providing a conductive paste in at least one of the openings which overlaps with the first conductor; and curing the conductive paste and the prepreg by heat treatment, thereby forming a second conductor and a second insulating film.

A method for manufacturing a terminal structure and a method for manufacturing an electronic element according to one embodiment of the present invention include the steps of forming a first conductor over a first insulating film; providing a conductive paste on the first conductor; forming one or more openings in a region of a prepreg, which overlaps with the first conductor when the prepreg is disposed over the first insulating film; disposing the prepreg having one or more openings over the first insulating film so that at least one of the openings overlaps with the conductive paste; and curing the conductive paste and the prepreg by heat treatment, thereby forming a second conductor and a second insulating film.

A method for manufacturing a terminal structure and a method for manufacturing an electronic element according to one embodiment of the present invention include the steps of forming a first conductor over a first insulating film; forming one or more openings in a region of a prepreg, which overlaps with the first conductor when the prepreg is disposed over the first conductor; providing a conductive paste in at least one of the openings in the prepreg; disposing the prepreg over the first insulating film so that the at least one of the openings in which the conductive paste is provided overlaps with the first conductor; and curing the conductive paste and the prepreg by heat treatment, thereby forming a second conductor and a second insulating film.

A step of forming a third conductor which is electrically connected to the second conductor can be added to the method for manufacturing the terminal structure and the electronic element according to any one of the above six embodiments. As an example of such a step, a step of electrically connecting an antenna to the second conductor is given.

In the method for manufacturing an electronic device, according to any one of the above six embodiments, in the case where an electronic element is provided over a substrate which is used when the electronic element is formed, a step of separating the substrate from the electronic element can be performed.

In one embodiment of the methods for manufacturing the terminal structure and the electronic device described in this specification, it is not necessary to perform a step of forming an opening with a laser beam after a prepreg is cured. Thus, an adverse effect in the step of forming an opening, such as a defect due to dust or damage caused by a laser beam, can be prevented.

BRIEF DESCRIPTION OF THE DRAWINGS

In the accompanying drawings:

FIGS. 4A and 4B are cross-sectional views illustrating an example of steps following the step in FIG. 2B;

FIGS. 7A to 7E are cross-sectional views illustrating an example of a method for manufacturing an electronic device according to one embodiment of the present invention;

FIGS. 8A to 8C are plan views each illustrating an example of a structure of a prepreg having an opening;

FIGS. 15A to 15D are cross-sectional views illustrating an example of a method for manufacturing an electronic device according to one embodiment of the present invention;

FIGS. 16A to 16D are cross-sectional views illustrating an example of steps following the step in FIG. 15D;

FIGS. 17A to 17C are cross-sectional views illustrating an example of steps following the step in FIG. 16D;

FIGS. 18A and 18B are cross-sectional views illustrating an example of steps following the step in FIG. 17C;

FIGS. 19A and 19B are cross-sectional views illustrating an example of steps following the step in FIG. 18B; and FIG. 20A is a cross-sectional view illustrating an example of a step following the step in FIG. 19B and illustrating an example of a structure of an electronic device, and FIGS. 20B to 20D are plan views each illustrating an example of the structure of the electronic device in FIG. 20A.

DETAILED DESCRIPTION OF THE INVENTION

Figure 1A:
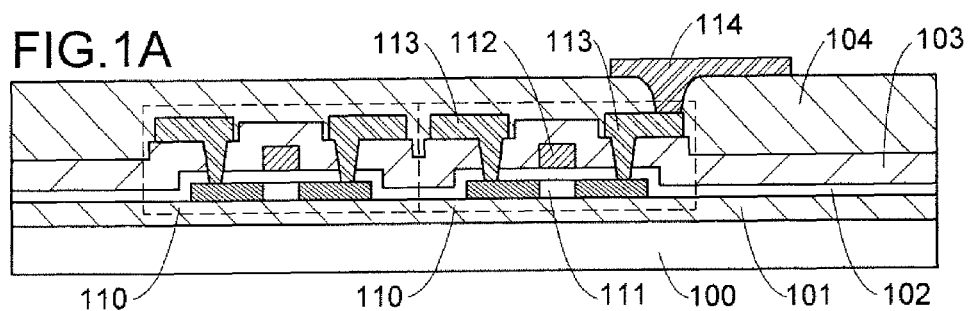
FIGS. 1A to 1D are cross-sectional views illustrating an example of a method for manufacturing an electronic device according to one embodiment of the present invention.

Embodiments of the invention disclosed in this specification will be described below with reference to the accompanying drawings. Note that in the drawings referred to in this specification, components denoted by the same reference numerals in different drawings represent the same components. Therefore, the description regarding such components, which is repetitive, will be omitted in some cases.

In addition, it is easily understood by those skilled in the art that modes of the invention disclosed in this specification are not limited to the description in the embodiments and can be modified in various ways. That is, the invention disclosed in this specification should not be interpreted as being limited to the description of the embodiments.

Embodiment 1

In this embodiment, a terminal structure provided with a conductor which penetrates a resin film formed from a cured prepreg and a method for manufacturing the terminal structure will be described. Further, in this embodiment, an electronic device provided with a terminal having such a structure and a method for manufacturing the electronic device will be described.

A terminal structure of this embodiment, a structure of an electronic device of this embodiment, a method for manufacturing the terminal structure, and a method for manufacturing the electronic device will be described with reference to FIGS. 1A to 1D, FIGS. 2A to 2C, FIGS. 3A to 3C, FIGS. 4A and 4B, and FIGS. 5A to 5C.

As illustrated in FIG. 1A, a substrate 100 over which one or more electronic elements 110 are formed with an insulating film 101 provided therebetween is prepared. There is no particular limitation on the electronic element 110 and a practitioner can determine the kind, the structure, the number, and the manufacturing method. As specific examples of the electronic element 110, a transistor, a resistor, a rectifier, a capacitor, a memory element, a photoelectric conversion element, a light-emitting element, a sensor element, and a wiring board are given.

In FIG. 1A, a transistor having an SOI structure is illustrated as an example of the electronic element 110. Two electronic elements 110 are illustrated in one electronic device for simplification. As illustrated in FIG. 1A, a semiconductor film 111, a conductor 112 serving as a gate electrode, and a conductor 113 serving as a source electrode and/or a drain electrode of the transistor are formed over the insulating film 101. Here, the insulating film 101 serves as a base insulating film of the electronic element 110. The semiconductor film 111 includes at least a channel formation region, a source region, and a drain region. The semiconductor film 111 of the transistor is covered with an insulating film 102, and the conductor 112 is formed over the insulating film 102. Here, the insulating film 102 serves as a gate insulating film of the transistor. The conductor 112 is covered with an insulating film 103, and the conductor 113 is formed over the insulating film 103.

As the substrate 100, a substrate such as a semiconductor substrate, a glass substrate, a quartz substrate, a sapphire substrate, a ceramic substrate, a stainless steel substrate, or a metal substrate can be used. As a semiconductor substrate, a silicon wafer obtained by slicing an ingot, an SOI substrate in which a single crystal semiconductor layer is formed over a substrate with an insulating film provided therebetween, or the like can be used. Further, in the case where a silicon wafer obtained by slicing an ingot is used as the substrate 100, the electronic element 110 including a semiconductor region can be formed using the silicon wafer (the substrate 100).

Each of the insulating films 101 to 103 may have either a single-layer structure or a layered structure. Insulating films used as the insulating films 101 to 103 are selected in consideration of the conditions of a manufacturing process of the electronic element 110 and the functions of these films. For example, an insulating film containing silicon and/or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, the following may be used: an insulating film formed from oxide of metal, such as aluminum oxide, tantalum oxide, or hafnium oxide; an insulating film formed from nitride of metal, such as aluminum nitride; an insulating film formed from oxynitride of metal, such as aluminum oxynitride; or an insulating film formed from nitride oxide of metal, such as aluminum nitride oxide. Furthermore, a resin film formed from a resin material such as acrylic, polyimide, polyamide, polyimideamide, or benzocyclobutene may be used. Note that in this specification, oxynitride is a substance in which the content of oxygen is larger than that of nitrogen and nitride oxide is a substance in which the content of nitrogen is larger than that of oxygen.

There are the following typical examples of the method for forming these insulating films: a CVD method (chemical vapor deposition method) such as a PECVD (plasma-excited CVD) method or a thermal CVD method; a PVD method (physical vapor deposition method) such as a sputtering method or a vapor deposition method; an ALD method (atomic layer deposition method); a method for forming a film with a liquid or paste material, such as a spin-coating method, a droplet discharging method, or a dip-coating method; solid-phase oxidation treatment or solid-phase nitridation treatment with plasma or heat; and the like.

Further, each of the conductors 112 and 113 may have either a single-layer structure or a layered structure. Each of the conductors 112 and 113 can be formed using a metal film containing single metal such as tantalum, tungsten, titanium, molybdenum, aluminum, chromium, niobium, gold, silver, copper, or platinum, as its main component, an alloy film, a metal compound film, or the like. For example, as the metal film, a copper film, a pure aluminum film, and an aluminum film to which Si, Nb, or the like is added are given. As the alloy film, an aluminum-copper alloy film and an aluminum-neodymium alloy film are given. As the metal compound film, a metal nitride film such as a titanium nitride film or a tungsten nitride film, and a silicide film such as a nickel silicide film or a cobalt silicide film are given. These conductive films can be formed with a PVD method such as a sputtering method or a vapor deposition method; a method for forming a film with a liquid or paste material, such as a printing method, a droplet discharging method, or a dip-coating method; a soldering method; a plating method; or the like.

The electronic element 110 is manufactured, and then, the insulating film 104 is formed to cover the electronic element 110 as illustrated in FIG. 1A. The insulating film 104 can be formed in a manner similar to those of the insulating films 101 to 103. For example, in the case where the insulating film 104 has a two-layer structure of a silicon nitride oxide film and a resin film, the insulating film 104 having an opening can be formed as follows. First, a silicon nitride oxide film with a thickness of approximately 50 nm to 300 nm is formed over the insulating film 103 in a PECVD apparatus using $SiH_4$, $N_2O$, $NH_3$, and $H_2$ for a source gas. Then, a film formed from an uncured photosensitive epoxy-phenol resin is formed over the silicon nitride oxide film by a printing method. Next, the uncured resin film is irradiated with light having an appropriate wavelength to be cured so that the resin film with a thickness of approximately 1 µm to 30 µm is formed. At that time, a portion of the resin film, which is to be a conduction region between the conductor 113 and the conductor 114, is not cured. After that, a first layer of the silicon nitride oxide film is etched, and thus, the insulating film 104 having the opening is completed.

Then, as illustrated in FIG. 1A, the conductor 114 which is electrically connected to at least one of the electronic elements 110 is formed over the insulating film 104. Here, the conductor 114 is formed to be in contact with the conductor 113 and is included in a terminal portion of the electronic device. Thus, the conductor 114 is electrically connected to at least one of the electronic elements 110.

Figure 3A:
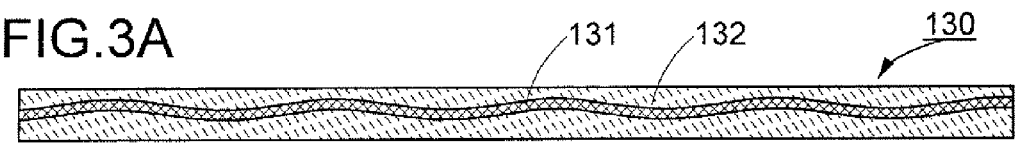
FIG. 3A is a cross-sectional view illustrating an example of a structure of a prepreg.

In this embodiment, the electronic element 110 is sealed with an insulating film (a resin film) formed using a prepreg. FIG. 3A is a cross-sectional view of an uncured prepreg 130 used in this embodiment. The uncured prepreg 130 (hereinafter referred to as a "prepreg 130") includes an uncured matrix resin 132 and a reinforcing material 131.

As the uncured matrix resin 132 (hereinafter referred to as a "matrix resin 132"), a resin cured by heat treatment can be used. For example, a thermosetting resin such as an epoxy resin, an unsaturated polyester resin, a polyimide resin, a bismaleimide-triazine resin, or a cyanate resin can be used. Alternatively, a thermoplastic resin such as a polyphenylene oxide resin, a polyetherimide resin, or a fluorocarbon polymer can be used. For example, when the matrix resin 132 is formed using a polyimide resin, the matrix resin 132 is cured to form an insulating film folioed using a polyimide resin. Note that the number of resins used for the matrix resin 132 is not limited to one, and a plurality of resins may be used.

Note that in this specification, an uncured resin and an uncured prepreg refer to both a resin and a prepreg in an uncured state and a resin and a prepreg in an incompletely cured state. The incompletely cured state is also referred to as a semi-cured state.

As the reinforcing material 131 used for the prepreg 130, fiber, a sheet fibrous body (also referred to as a fibrous sheet), a filler, and the like are given. The sheet fibrous body is a sheet substance formed using fiber and for example, a woven fabric and a nonwoven fabric each correspond to the sheet fibrous body. The way of weaving a woven fabric used for the sheet fibrous body is not particularly limited and for example, a plain-woven fabric, a twilled fabric, a satin-woven fabric, or the like can be used as the sheet fibrous body.

High-strength fiber is preferably used as fiber used for the reinforcing material 131. The high-strength fiber is specifically fiber with a high modulus of elasticity in tension or fiber with a high Young's modulus. As the high-strength fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like are given. As the glass fiber, glass fiber using E glass, S glass, D glass, Q glass, or the like is given. For example, a woven fabric formed from glass fiber is called glass cloth.

There is no particular limitation on a yarn bundle (e.g., the cross-sectional shape or the processing method) used for the reinforcing material 131. The cross-sectional shape may be a circular shape, an elliptical shape, or a flat shape. A sheet fibrous body formed using a yarn bundle which has been subjected to fiber opening is preferably used for the reinforcing material 131 because the yarn bundle subjected to fiber opening has a large width, has a smaller number of single yarns in the thickness direction, and thus is easily flattened in cross section. Flattening the yarn bundle in cross section makes the thickness of the fibrous body small, which reduces the thickness of the reinforcing material 131. Accordingly, the uncured prepreg 130 can be thin.

In this embodiment, a sheet fibrous body is employed as the reinforcing material 131. In this case, the prepreg 130 can be formed as follows: a sheet fibrous body is impregnated with a composition obtained by dilution of the matrix resin 132 with an organic solvent; and then the organic solvent is volatilized by drying so that the matrix resin 132 is semi-cured.

Note that instead of the prepreg 130, a film formed using an uncured resin which does not include the reinforcing material 131 can be used. It is preferable to use the prepreg 130 including the reinforcing material 131 because the electronic device can be reinforced.

Figure 3B:
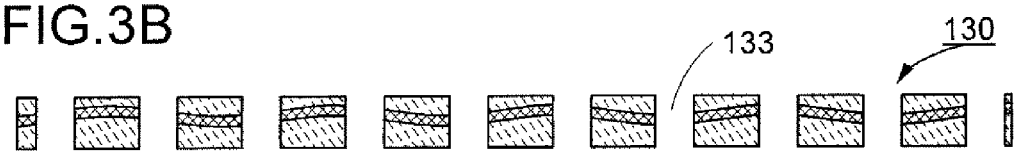
FIG. 3B is a cross-sectional view illustrating an example of a structure of a prepreg having a plurality of openings.

In this embodiment, a plurality of openings 133 (through holes) is formed in the uncured prepreg 130 in order to form a terminal portion of the electronic device. FIG. 3B is a cross-sectional view of the prepreg 130 having the plurality of openings 133. These openings 133 are formed so that the electronic element 110 is electrically connected to the terminal portion. The openings 133 can be formed by a laser beam, punching treatment, drill treatment, or the like. The method for forming the openings 133 can be determined by a practitioner in consideration of the number, the size, the shape, the layout, and the like of the openings 133.

Figure 1B:
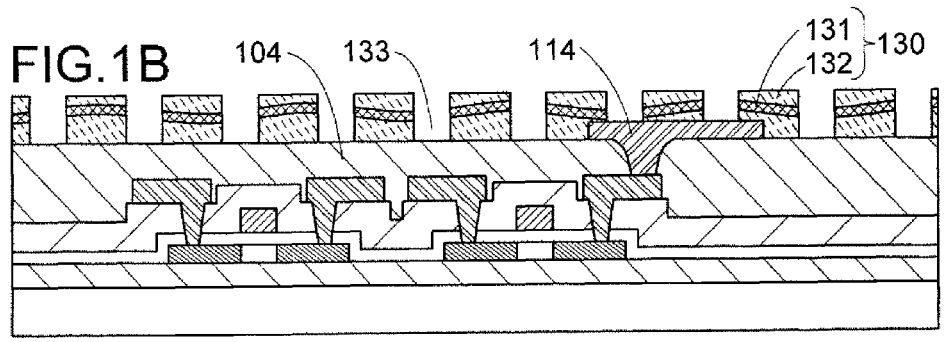
Figure 3C:
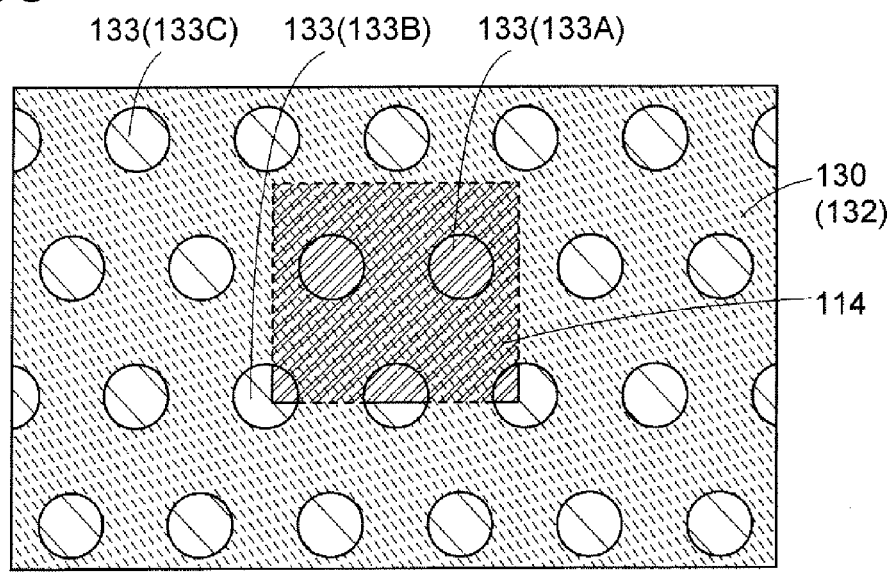
FIG. 3C is a plan view of the prepreg illustrated in FIG. 1B.

Then, as illustrated in FIG. 1B, the prepreg 130 having the plurality of openings 133 is attached to an insulating film 104 and the conductor 114. FIG. 3C is a top view of the prepreg 130 attached to the insulating film 104 and the conductor 114. FIG. 3C corresponds to a plan view of FIG. 1B. Note that the reinforcing material 131 included in the prepreg 130 is not illustrated in FIG. 3C.

The number, the size, the shape, the layout, and the like of the openings 133 are determined in consideration of characteristics (e.g., a resistance value) which are needed for a circuit layout and a circuit design. In a state in which the prepreg 130 is fixed to the insulating film 104, at least one of the openings 133 may overlap with the conductor 114. The description the opening 133 overlaps with the conductor 114" includes the case where the whole of the opening 133 overlaps with the conductor 114 and the case where part of the opening 133 overlaps with the conductor 114.

In this embodiment, the openings 133 are formed in the whole area of the prepreg 130; thus, one or more openings 133 can overlap with the conductor 114 without particular positioning of the openings 133 and the conductor 114. That is, precise positioning of the openings 133 and the conductor 114 is not needed depending on the number, the size, the shape, the layout, and the like of the openings 133 formed in the prepreg 130.

In this embodiment, as illustrated in FIG. 3C, the plurality of openings 133 formed in the prepreg 130 is categorized into an opening 133A, an opening 133B, and an opening 133C. The openings 133A and 133B overlap with the conductor 114, and the opening 133C does not overlap with the conductor 114. In FIG. 3C, the openings 133 which overlap with the conductor 114 can be categorized into the opening 133A and the opening 133B. The opening 133A is an opening the whole of which overlaps with the conductor 114, whereas the opening 133B is an opening part of which overlaps with the conductor 114.

In the case where the size of the opening 133 is small with respect to the conductor 114 as in FIG. 3C, the plurality of openings 133 preferably overlap with the conductor 114. As smaller the size of the opening 133 is, it is easier to fill the opening 133 which is not included in the terminal portion like the opening 133C, with the matrix resin 132 when the prepreg 130 is cured. In the case where the plurality of openings 133 overlap with the conductor 114, there are advantages that the acceptable range of positioning of the opening 133 and the conductor 114 is broadened and that increase in the resistance value of the terminal portion can be suppressed.

Figure 1C:
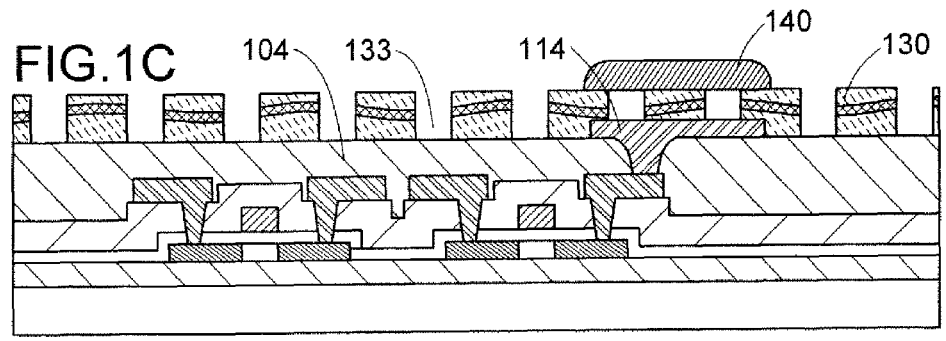
Figure 1D:
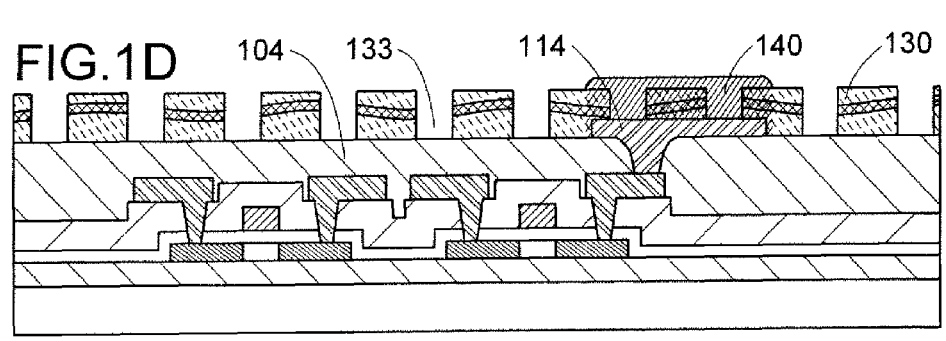

After the prepreg 130 in which the plurality of openings 133 is formed is attached to the insulating film 104, a conductive paste 140 is provided in the openings 133 which overlap with the conductor 114. FIGS. 1C and 1D are cross-sectional views illustrating this step.

First, as illustrated in FIG. 1C, the conductive paste 140 is provided in a region which overlaps with the conductor 114 over the prepreg 130. The conductive paste 140 includes a conductive particle (or the conductive powder), a thermosetting resin binder, and a solvent. As the material of the conductive powder or the conductive particle included in the conductive paste, for example, metal such as Ag, Au, Cu, Ni, Pt, Pd, Nb, Ta, or Ti; an alloy of any of these metal materials (e.g., Ag—Pd); and the like are given. As the resin binder, an acrylic-based resin, an epoxy-based resin, a polyimide-based resin, and the like are given.

A droplet discharge method (an inkjet method, a dispensing method, and the like are included), a printing method such as a screen printing method, or the like is employed in order to provide the conductive paste 140 in a desired region of the prepreg 130. As illustrated in FIG. 1D, part of the conductive paste 140 provided over the prepreg 130 flows into the opening 133 to be in contact with the conductor 114.

Depending on the kind of the solvent included in the conductive paste 140, the matrix resin 132 included in the prepreg 130 is dissolved and the conductive particles (or the conductive powder) included in the conductive paste 140 are dispersed into the dissolved matrix resin 132 in some cases. FIG. 1D schematically illustrates such a state. Even in such a case, since the opening 133 is formed in the prepreg 130, a path through which the conductive paste 140 moves is mainly the opening 133; thus, the opening 133 can be a conduction path of an extraction electrode (or an extraction wiring) for the conductor 114. Accordingly, the conductor which penetrates the cured prepreg 130 can be formed.

The main role of the solvent included in the conductive paste 140 is, in curing treatment of the prepreg 130, to prevent the matrix resin 132 from flowing to fill the opening 133 in which the conductive paste 140 is provided.

Figure 2A:
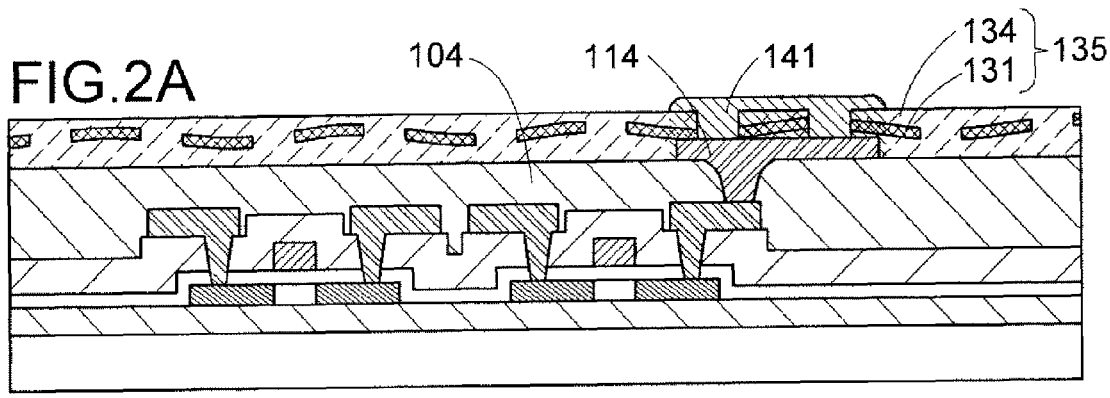
FIGS. 2A to 2C are cross-sectional views illustrating an example of steps following the step in FIG. 1D.

Next, the prepreg 130 and the conductive paste 140 are heated while being pressed so as to be cured. In this curing step, it is preferable that the prepreg 130 and the conductive paste 140 be heated while being pressed, and the curing step can be performed with a vacuum heat press. As illustrated in FIG. 2A, an insulating film 135 for sealing the electronic element 110 is formed from the prepreg 130 and a conductor 141 included in a terminal is formed from the conductive paste 140, by heat treatment (curing treatment). In the insulating film 135, a resin 134 corresponds to the matrix resin 132 which has been cured. The prepreg 130 has the opening 133 in which the conductive paste 140 is not provided and the opening 133 in which the conductive paste 140 is provided with a space; however, the insulating film 135 obtained by the heat treatment does not have the openings 133. This is because the matrix resin 132 becomes fluid and fills the through holes in the step of curing the prepreg 130.

As the conductive paste 140, it is preferable to select a substance which is cured at a temperature lower than the temperature at which the matrix resin 132 starts to become fluid. Since the conductive paste 140 is cured at a temperature lower than the temperature at which the matrix resin 132 starts to become fluid, the conductive paste 140 provided in the opening 133 can be cured before the matrix resin 132 flows into the opening 133 in which the conductive paste 140 is provided. As a result, the connection resistance between the conductor 114 and the conductor 141 can be lowered. In the case where the solvent included in the conductive paste 140 dissolves the matrix resin 132, the conductive paste 140 provided in the opening 133 prevents the matrix resin 132 from flowing into the opening 133.

Figure 2B:
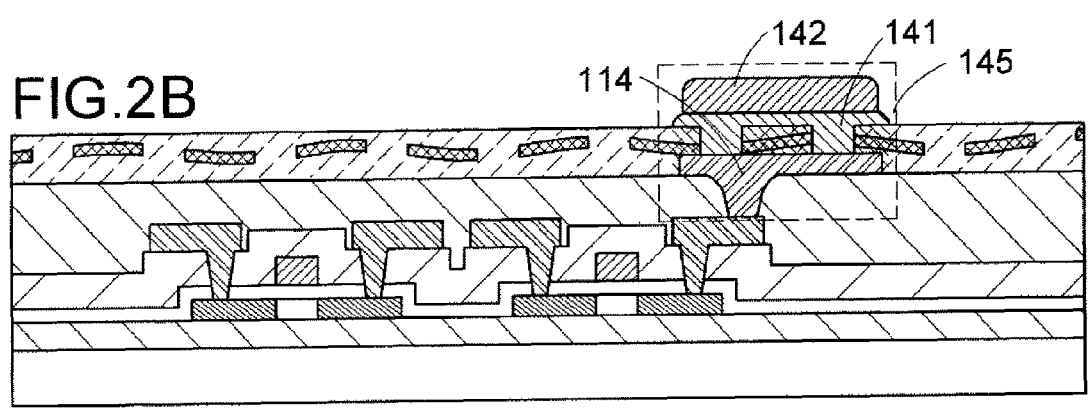

Next, as illustrated in FIG. 2B, a conductor 142 which is electrically connected to the conductor 141 is formed. Here, the conductor 142 is closely attached to the conductor 141. Like the conductor 141, the conductor 142 can be formed using a conductive paste. A terminal portion 145 of the electronic device is manufactured through the step of forming the conductor 114 to the step of forming the conductor 142. The terminal portion 145 includes the conductor 114, the conductor 141, and the conductor 142. The conductors 114, 141, and 142 may include a portion serving as a wiring or a different electrode, not only include a portion serving as the terminal portion 145. Note that in the case where electrical connection with another electronic device is possible with the use of the conductor 141, the conductor 142 is not necessarily formed.

The insulating film 135 for covering the conductor 114 is a resin film obtained by curing the prepreg 130. Since the openings 133C in which the conductive paste 140 is not provided are formed in the prepreg 130 illustrated in FIG. 3C, in the case of using a sheet fibrous body as the reinforcing material 131, the insulating film 135 includes the sheet fibrous body in which the plurality of openings 133 is formed. Since the conductive paste 140 is in contact with the prepreg 130 which is not cured, in the case where the solvent included in the conductive paste 140 dissolves the matrix resin 132 included in the prepreg 130, the conductive particles or the conductive powder are dispersed into a portion where the opening 133 does not exist (a portion where the reinforcing material 131 exists). As a result, the cured prepreg 130 (the insulating film 135) includes a portion which overlaps with the conductor 141 and which contains the reinforcing material 131 and the conductive particles or the conductive powder.

Figure 2C:
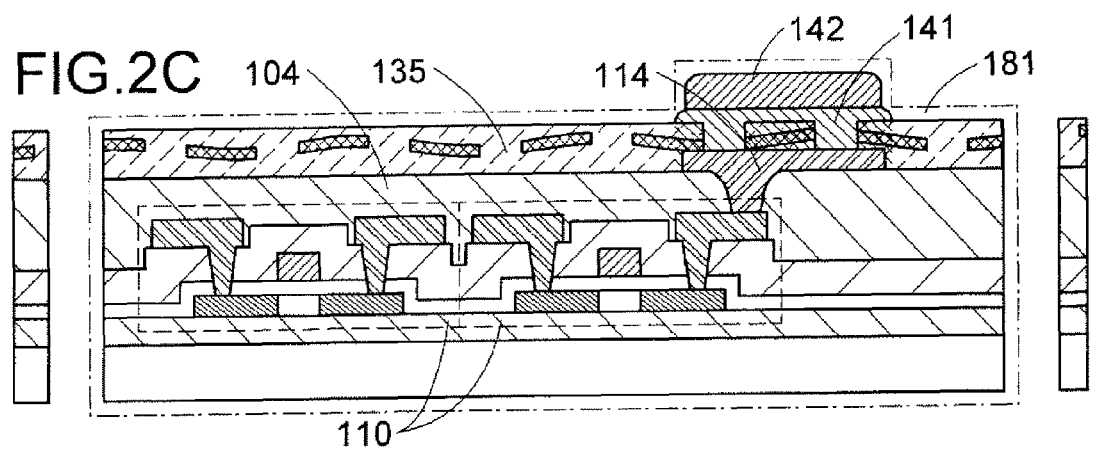

After the step illustrated in FIG. 2B, the substrate 100 over which a stack is formed is cut so that individual electronic devices 181 are obtained (see FIG. 2C). This step can be performed with treatment such as dicing or scribing. Before the substrate 100 is cut, the substrate 100 may be thinned by performing grinding treatment and/or polishing treatment.

As illustrated in FIG. 2C, the electronic device 181 includes one or more electronic elements 110 covered with the insulating film 104 and the terminal portion 145 electrically connected to at least one of the electronic elements 110. The terminal portion 145 includes the conductor 114, the conductor 141, and the conductor 142. The conductor 114 is formed over the insulating film 104 and is electrically connected to the at least one of the electronic elements 110. The conductor 141 is electrically connected to the conductor 114 and penetrates the insulating film 135. The conductor 142 is electrically connected to the conductor 141. The electronic device 181 can be electrically connected to another electronic device (such as an integrated circuit, a wiring circuit, or an antenna) through the conductor 142.

Before the substrate 100 is cut, the prepreg 130 including the reinforcing material 131 may be attached to the substrate 100 side. Then, the prepreg 130 is cured to form an insulating film 136 which covers the rear surface of the substrate 100 as illustrated in FIG. 4A. The insulating film 136 is formed from the resin 134 including the reinforcing material 131 in a manner similar to that of the insulating film 135. The insulating film 136 may be formed from a prepreg which does not include the reinforcing material 131. Then, as illustrated in FIG. 4B, a stack between the insulating film 135 and the insulating film 136 is cut so that individual electronic devices 182 are obtained. The insulating film 136 serves as a sealing film on the substrate 100 side. The structure of the electronic device 182 is similar to that of the electronic device 181 in FIG. 2C except that the insulating film 136 including the reinforcing material 131 is formed on the rear surface of the substrate 100.

Figure 5A:
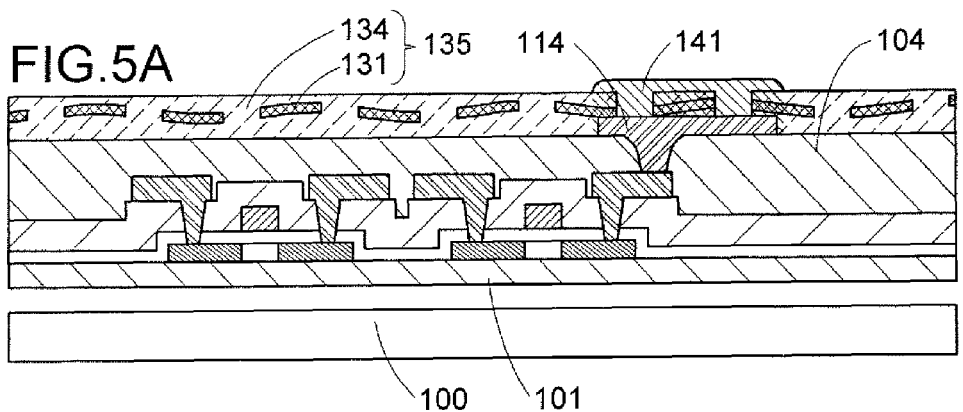
FIGS. 5A to 5C are cross-sectional views illustrating an example of steps following the step in FIG. 2B.
Figure 5B:
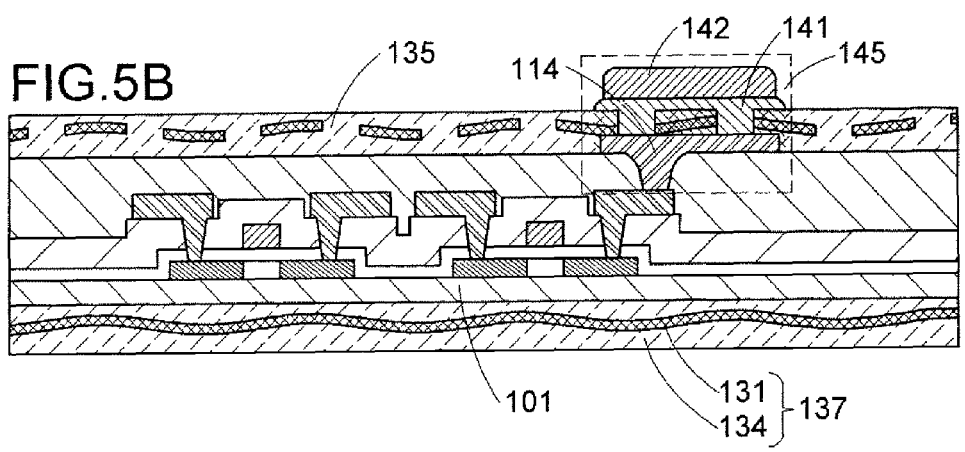
Figure 5C:
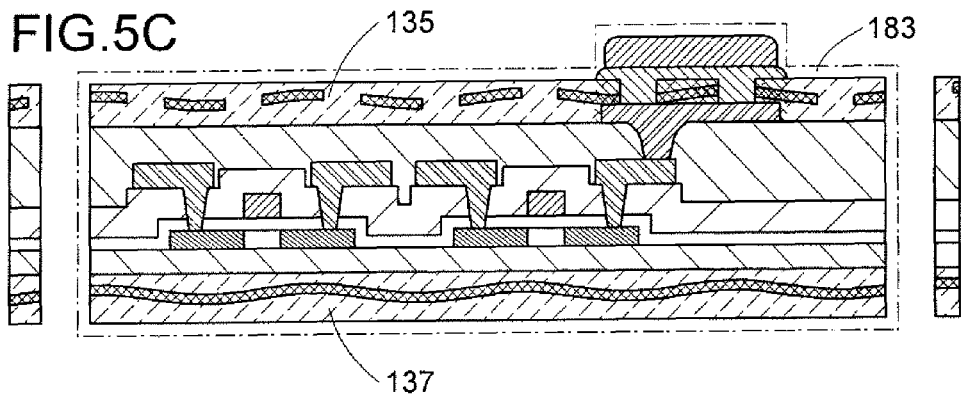

As illustrated in FIG. 5A, the substrate 100 used for manufacture of the electronic element 110 may be separated from the electronic element 110. Then, the prepreg 130 including the reinforcing material 131 is provided in a portion which is exposed by the separation of the substrate 100. Here, the prepreg 130 is attached to the insulating film 101 and after that, the prepreg 130 is cured to form an insulating film 137 which overlaps with the insulating film 101 as illustrated in FIG. 5B. Then, as illustrated in FIG. 5C, a stack between the insulating film 135 and the insulating film 137 is cut so that individual electronic devices 183 are obtained. The insulating film 137 serves as a sealing film on the insulating film 101 side.

The structure of the electronic device 183 is similar to that of the electronic device 181 in FIG. 2C except that the substrate 100 is removed and the insulating film 137 including the reinforcing material 131 is formed on the insulating film 101. As described above, by removing the substrate 100, the electronic device 183 which can be curved or bended can be manufactured.

Note that a prepreg including a reinforcing material is used for forming a sealing film in this embodiment; however, an uncured resin film which does not include a reinforcing material can be used instead of the prepreg.

As described above, when this embodiment is applied to the manufacture of a terminal structure, it is not necessary to perform a step of forming an opening in an insulating film for covering an electronic element or a conductor with a laser beam. Therefore, damage to the terminal or the electronic element caused by a laser beam, defects of the terminal or the electronic element due to dust generated in the step of forming an opening, and the like can be prevented.

In addition, a conductor which penetrates an insulating film formed from a prepreg can be easily manufactured. As specific effects, positioning of the openings formed in the insulating film in order to penetrate the conductor is not necessary, the sizes of the openings can be easily made uniform, or the like are given. As a result, a terminal and an electronic device which have electronic characteristics with the designed value can be easily manufactured, and the reliability of the terminal and the electronic device can be increased.

This embodiment can be combined with any of the other embodiments as appropriate.

Embodiment 2

In Embodiment 2, a terminal structure provided with a conductor which penetrates a resin film formed from a cured prepreg and a method for manufacturing the terminal structure will be described. Further, in this embodiment, an electronic device provided with a terminal having such a structure and a method for manufacturing the electronic device will be described.

According to the method for manufacturing a terminal structure and an electronic device in Embodiment 1, the prepreg 130 is fixed to the insulating film 104, and then the conductive paste 140 is provided in the opening in the prepreg 130. In Embodiment 2, a method for manufacturing a terminal structure and an electronic device in which a conductive paste 150 is provided over the conductor 114 and then the prepreg 130 is fixed to the insulating film 104 will be described.

Figure 6A:
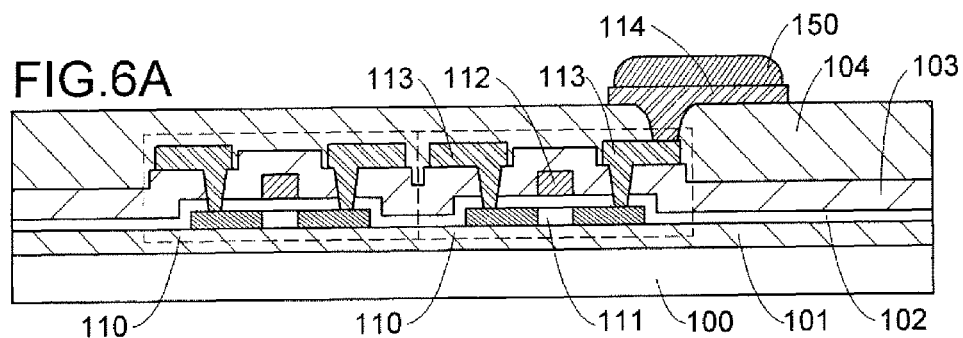
FIGS. 6A to 6D are cross-sectional views illustrating an example of a method for manufacturing an electronic device according to one embodiment of the present invention.

First, as illustrated in FIG. 1A, the electronic element 110 and the conductor 114 which is electrically connected to the electronic element 110 are formed over the substrate 100. Then, as illustrated in FIG. 6A, the conductive paste 150 is provided to be in contact with a top surface of the conductor 114. Like the conductive paste 140 in Embodiment 1, the conductive paste 150 can be provided over the conductor 114 by a droplet discharge method (an inkjet method, a dispensing method, and the like are included), a printing method such as a screen printing method, or the like.

Next, the prepreg 130 having the plurality of openings 133 illustrated in FIGS. 3B and 3C is attached onto the insulating film 104. When the prepreg 130 is subjected to pressure bonding to the insulating film 104 with a vacuum heat press or the like, the conductive paste 150 is spread by the prepreg 130 and flows into the opening 133 which overlaps with the conductor 114; thus, some of the openings 133 are filled with the conductive paste 150 as illustrated in FIG. 6B.

In the case where a solvent included in the conductive paste 150 dissolves the matrix resin 132 included in the prepreg 130, the conductive paste 150 is spread by the prepreg 130; thus, the conductive particles (or the conductive powder) of the conductive paste 150 which has not been filled in the openings 133 are dispersed into the matrix resin 132. FIG. 6B illustrates such a state.

Then, the prepreg 130 and the conductive paste 150 are heated while being pressed so as to be cured. This curing step can be performed in a manner similar to that in FIG. 2A. As illustrated in FIG. 6C, an insulating film 161 for sealing the electronic element 110 is formed from the prepreg 130 and a conductor 151 included in a terminal is formed from the conductive paste 150, by heat treatment (curing treatment). In the insulating film 161, a resin 162 corresponds to the matrix resin 132 which has been cured. The prepreg 130 has the opening 133 in which the conductive paste 150 is not provided and the opening 133 in which the conductive paste 150 is provided with a space; however, like the insulating film 135 (illustrated in FIG. 2C), the insulating film 161 obtained by the heat treatment does not have the openings 133. This is because the matrix resin 132 becomes fluid by the heat treatment and fills the through holes in the step of curing the prepreg 130.

Figure 6B:
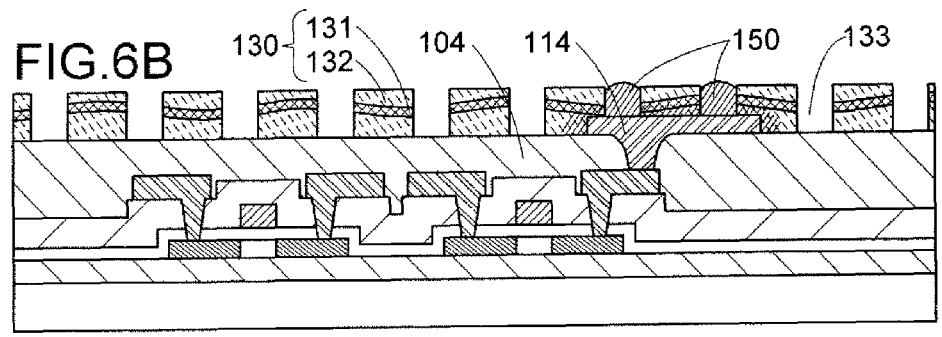
Figure 6C:
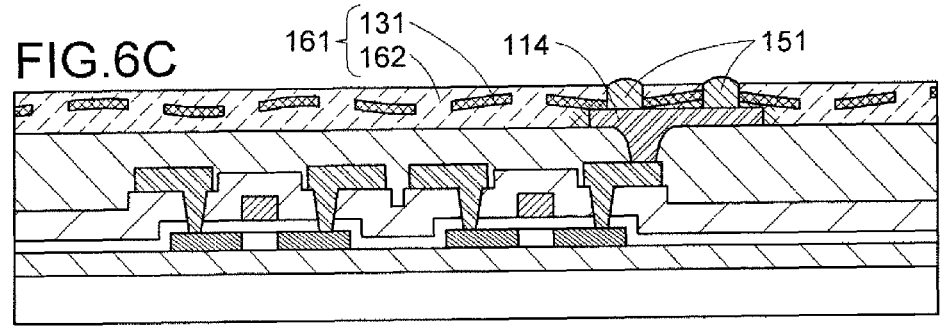

The steps of FIGS. 6B and 6C can be successively performed with a vacuum heat press. Heat treatment is performed while the prepreg 130 is subjected to pressure bonding to the insulating film 104 with a vacuum heat press, and the prepreg 130 and the conductive paste 150 are cured, so that the insulating film 161 and the conductor 151 are formed.

Figure 6D:
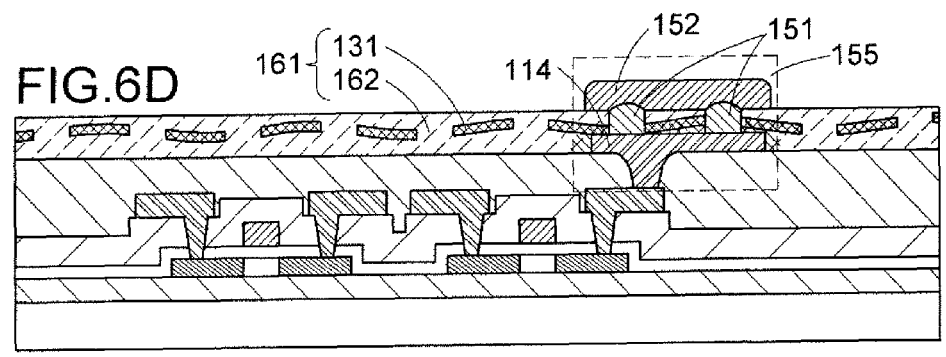

Next, as illustrated in FIG. 6D, a conductor 152 which is electrically connected to the conductor 151 is formed. Like the conductor 141, the conductor 152 can be formed using a conductive paste. A terminal portion 155 of the electronic device is manufactured through the step of forming the conductor 114 to the step of forming the conductor 152. The terminal portion 155 includes the conductor 114, the conductor 151, and the conductor 152. The conductors 114, 151, and 152 may include a portion serving as a wiring or a different electrode, not only include a portion serving as the terminal portion 155. Note that in the case where electrical connection with another electronic device is possible with the use of the conductor 151, the conductor 152 is not necessarily formed.

The steps following the step of FIG. 6D are performed in a manner similar to that in Embodiment 1; thus, the electronic device provided with the electronic element 110 and the terminal portion 155 electrically connected to the electronic element 110 can be manufactured.

As in Embodiment 1, the insulating film 161 for covering the conductor 114 is a resin film obtained by curing the prepreg 130 having the plurality of openings 133 in this embodiment; thus, the insulating film 161 has a structure which is similar to that of the insulating film 135. That is, the insulating film 161 includes a sheet fibrous body in which the plurality of openings 133 is formed. Further, the insulating film 161 includes a portion where the reinforcing material 131 and the conductive particles or the conductive powder exist in a region which overlaps with the conductor 151 in some cases, depending on the kind of the solvent included in the conductive paste 150.

As described above, when this embodiment is applied to the manufacture of a terminal structure, it is not necessary to perform a step of forming an opening in an insulating film for covering an electronic element or a conductor with a laser beam. Therefore, damage to the electronic element or the terminal caused by a laser beam, defects of the electronic element or the terminal due to dust generated in the step of forming an opening, and the like can be prevented.

In addition, a conductor which penetrates an insulating film formed from a prepreg can be easily manufactured. As specific effects, for example, high-accuracy positioning for determining where the conductor is formed is not necessary, and the sizes of the openings can be easily made uniform. As a result, the reliability of the electronic device can be increased.

This embodiment can be combined with any of the other embodiments as appropriate.

Embodiment 3

In Embodiment 3, a terminal structure provided with a conductor which penetrates a resin film formed from a cured prepreg and a method for manufacturing the terminal structure will be described. Further, in this embodiment, an electronic device provided with a terminal having such a structure and a method for manufacturing the electronic device will be described.

According to the method for manufacturing a terminal structure and an electronic device in Embodiment 1, the prepreg 130 is fixed to the insulating film 104, and then the conductive paste 140 is provided in the opening in the prepreg 130. In Embodiment 3, a method for manufacturing a terminal structure and an electronic device in which a conductive paste 170 is provided over the prepreg 130, and then the prepreg 130 is fixed to the insulating film 104 will be described.

As illustrated in FIG. 1A, the electronic element 110 and the conductor 114 which is electrically connected to the electronic element 110 are formed over the substrate 100.

As illustrated in FIG. 7A, a conductive paste 170 is provided to be in contact with a top surface of the prepreg 130 having the plurality of openings 133. Like the conductive paste 140 in Embodiment 1, the conductive paste 170 can be provided in a desired region of the prepreg 130 by a droplet discharge method (an inkjet method, a dispensing method, and the like are included), a printing method such as a screen printing method, or the like.

When the conductive paste 170 is provided over the prepreg 130, part of the conductive paste 170 fills the openings 133. Depending on the kind of the solvent included in the conductive paste 170, the matrix resin 132 included in the prepreg 130 is dissolved and the conductive particles (or the conductive powder) included in the conductive paste 170 are dispersed into the dissolved matrix resin 132 in some cases. FIG. 7B schematically illustrates such a state.

Next, the prepreg 130 provided with the conductive paste 170 is attached onto the insulating film 104. The positioning of the prepreg 130 is performed in order that the opening 133 provided with the conductive paste 170 overlaps with the conductor 114. The prepreg 130 is closely attached to the insulating film 104, so that the conductive paste 170 in the opening 133 is in contact with the conductor 114 as illustrated in FIG. 7C.

Then, the prepreg 130 and the conductive paste 170 are heated while being pressed so as to be cured. This curing step can be performed in a manner similar to that in FIG. 2A. In this curing step, it is preferable that the prepreg 130 and the conductive paste 170 be heated while being pressed, and the curing step can be performed with a vacuum heat press. As illustrated in FIG. 7D, an insulating film 163 for sealing the electronic element 110 is formed from the prepreg 130 and a conductor 171 included in a terminal is formed from the conductive paste 170, by heat treatment (curing treatment). In the insulating film 163, a resin 164 corresponds to the matrix resin 132 which has been cured. The prepreg 130 has the opening 133 in which the conductive paste 170 is not provided and the opening in which the conductive paste 170 is provided with a space; however, like the insulating film 135 (illustrated in FIG. 2C), the insulating film 163 does not have the openings 133. This is because the matrix resin 132 becomes fluid by the heat treatment and fills the through holes in the step of curing the prepreg 130.

Next, as illustrated in FIG. 7E, a conductor 172 which is electrically connected to the conductor 171 is formed. Like the conductor 141, the conductor 172 can be formed using a conductive paste. A terminal portion 175 of the electronic device is manufactured through the step of forming the conductor 114 to the step of forming the conductor 172. The terminal portion 175 includes the conductor 114, the conductor 171, and the conductor 172. The conductors 114, 171, and 172 may include a portion serving as a wiring or a different electrode, not only include a portion serving as the terminal portion 175. Note that in the case where electrical connection with another electronic device is possible with the use of the conductor 171, the conductor 172 is not necessarily formed.

The steps following the step of FIG. 7E are performed in a manner similar to that in Embodiment 1; thus, the electronic device provided with the electronic element 110 and the terminal portion 175 electrically connected to the electronic element 110 can be manufactured.

As in Embodiment 1, the insulating film 163 for covering the conductor 114 is a resin film obtained by curing the prepreg 130 having the plurality of openings 133 in this embodiment; thus, the insulating film 163 has a structure which is similar to that of the insulating film 135. That is, the insulating film 163 includes a sheet fibrous body in which the plurality of openings 133 is formed. Further, the insulating film 163 includes a portion where the reinforcing material 131 and the conductive particles or the conductive powder exist in a region which overlaps with the conductor 171 in some cases, depending on the kind of the solvent included in the conductive paste 170.

As described above, when this embodiment is applied to the manufacture of a terminal structure, it is not necessary to perform a step of forming an opening in an insulating film for covering an electronic element or a conductor with a laser beam. Therefore, damage to the electronic element or the terminal caused by a laser beam, defects of the terminal or the electronic element due to dust generated in the step of forming an opening, and the like can be prevented.

In addition, a conductor which penetrates an insulating film formed from a prepreg can be easily manufactured. As specific effects, for example, high-accuracy positioning for determining where the conductor is formed is not necessary, and the sizes of the openings through which the conductor penetrates the insulating film can be easily made uniform. As a result, the reliability of the electronic device can be increased.

This embodiment can be combined with any of the other embodiments as appropriate.

Embodiment 4

According to the method for manufacturing a terminal structure in Embodiment 1, the openings 133 are formed in the entire surface of the prepreg 130 as illustrated in FIG. 3C in order to form a conductor which penetrates a resin film for covering the electronic element 110. In the case of manufacturing any of the terminal structures described in this specification, at least one opening 133 may be formed in the prepreg 130 in a region which overlaps with the conductor 114. In Embodiment 4, a prepreg having an opening, which has a structure different from the structure illustrated in FIG. 3C, will be described with reference to FIGS. 8A to 8C.

FIGS. 8A to 8C are plan views each illustrating a structure of an uncured prepreg having an opening. Note that an uncured prepreg is described as a "prepreg" in this embodiment. Like the prepreg 130 in Embodiment 1, the prepreg in this embodiment includes the reinforcing material 131 and the matrix resin 132. As in FIG. 3C, the reinforcing material 131 is not illustrated in FIGS. 8A to 8C.

Structure Example 1 of Prepreg

As illustrated in FIG. 8A, an opening 201 is formed in a region 200 surrounded by the dashed-dotted line in a prepreg 211. The region 200 corresponds to a region where the prepreg 211 overlaps with the conductor 114 when the prepreg 211 is attached to the insulating film 104. According to the manufacturing method described in any of Embodiments 1 to 3, a terminal structure and an electronic device can be manufactured using the prepreg 211 having the opening 201.

Structure Example 2 of Prepreg

As illustrated in FIG. 8B, a plurality of openings 202 are formed in the region 200 overlapping with the conductor 114 in a prepreg 212. According to the manufacturing method described in any of Embodiments 1 to 3, a terminal structure and an electronic device can be manufactured using the prepreg 212 having the openings 202.

Structure Example 3 of Prepreg

As illustrated in FIG. 8C, a prepreg 213 has a plurality of openings 203 in the region 200 like the prepreg 212. Further, the prepreg 213 has the openings 203 in a region which does not overlap with the conductor 114, which is different from the prepreg 212. According to the manufacturing method described in any of Embodiments 1 to 3, a terminal structure and an electronic device can be manufactured using the prepreg 213 having the openings 203. The positioning when the prepreg 213 is attached to the insulating film 104 is easy as compared with the prepreg 211 or the prepreg 212.

The opening 201, the openings 202, and the openings 203 can be formed by laser beam treatment, punching treatment, drill treatment, or the like in a manner similar to that of the opening 133 (see FIG. 2B).

With the use of a prepreg having at least one opening as in FIGS. 8A to 8C, a conductor which penetrates an insulating film (a resin film) formed from such a prepreg can be easily manufactured. In other words, as in Embodiment 1, high-accuracy positioning for determining where the conductor is formed is not necessary, and the sizes of the openings through which the conductor penetrates the insulating film can be easily made uniform, for example. Further, defects of the electronic element due to dust generated in the step of forming an opening, the energy of a laser beam, or the like can be prevented because a step of forming an opening with a laser beam is not necessary. Therefore, the reliability of the terminal and the electronic device can be increased.

Embodiment 5

In Embodiment 5, a sheet fibrous body which can be applied to the reinforcing material of the prepreg will be described.

Structure Example 1 of Sheet Fibrous Body

Figure 9A:
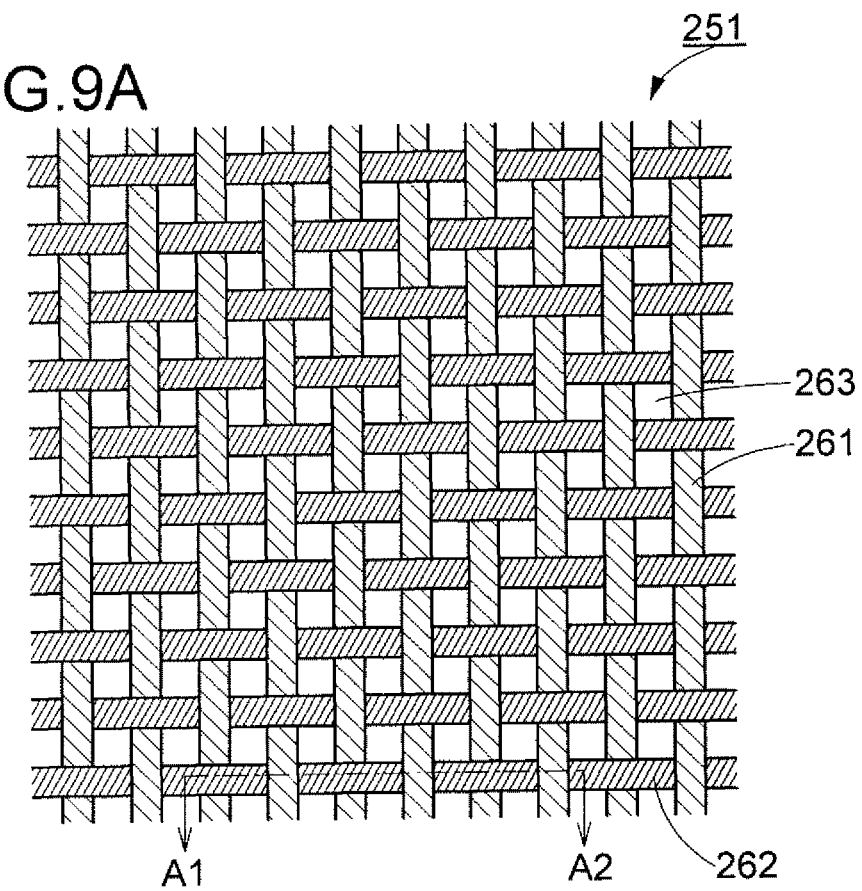
FIG. 9A is a plan view illustrating an example of a structure of a sheet fibrous body which is applied to the prepreg in FIG. 3A.
Figure 9B:
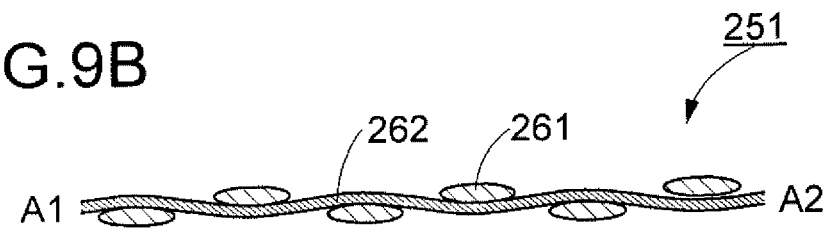
FIG. 9B is a cross-sectional view taken along line A1-A2 in FIG. 9A.

FIG. 9A is a plan view illustrating an example of a structure of a sheet fibrous body 251. FIG. 9B is a cross-sectional view illustrating the example of the structure of the sheet fibrous body 251, which is taken along line A1-A2 in FIG. 9A.

As illustrated in FIG. 9A, the sheet fibrous body 251 is a plain-woven fabric which is obtained by alternately weaving a warp yarn 261 and a weft yarn 262 so that they intersect with each other. The sheet fibrous body 251 has basket holes 263 each of which is a region including neither the warp yarn 261 nor the weft yarn 262. A conductive material provided for forming the conductor 141 passes through the basket holes 263, so that the conductor 114 and the conductor 141 can be in contact with each other.

There is no particular limitation on a yarn bundle (the warp yarn 261 and the weft yarn 262) (e.g., the cross-sectional shape or the processing method) used for the sheet fibrous body 251. The cross-sectional shape may be a circular shape, an elliptical shape, or a flat shape. A yarn bundle which has been subjected to fiber opening is preferably used for the warp yarn 261 and the weft yarn 262 because the yarn bundle subjected to fiber opening has a large width, has a smaller number of single yarns in the thickness direction, and thus is easily flattened in cross section. For example, as illustrated in FIG. 9B, by using the warp yarn 261 having a flat cross section and the weft yarn 262 having a flat cross section, the sheet fibrous body 251 can be thin.

Structure Example 2 of Sheet Fibrous Body

Figure 10:
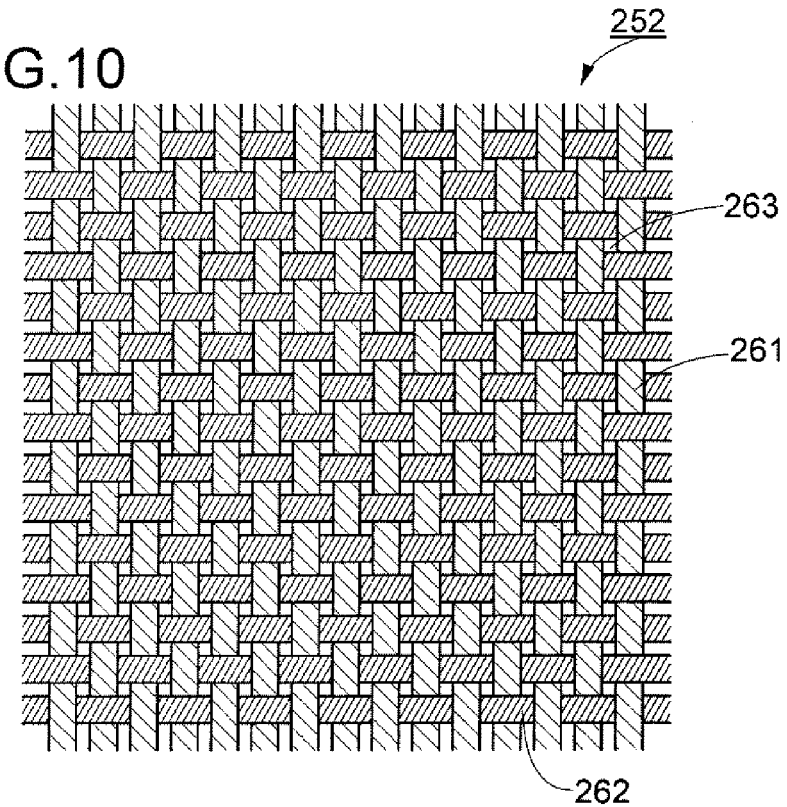
FIG. 10 is a plan view illustrating an example of the structure of the sheet fibrous body which is applied to the prepreg in FIG. 3A.

As a means to increase the strength of a cured prepreg, reduction in area of a basket hole is given. FIG. 10 illustrates a plan view of a sheet fibrous body 252 having such a structure example. As illustrated in FIG. 10, the sheet fibrous body 252 is a plain-woven fabric which is obtained by alternately weaving the warp yarn 261 and the weft yarn 262 so that they intersect with each other, like the sheet fibrous body 251. In the sheet fibrous body 252, the density of the warp yarn 261 and the weft yarn 262 is high and the basket hole 263 is small, as compared with the sheet fibrous body 251.

Structure Example 3 of Sheet Fibrous Body

Figure 11:
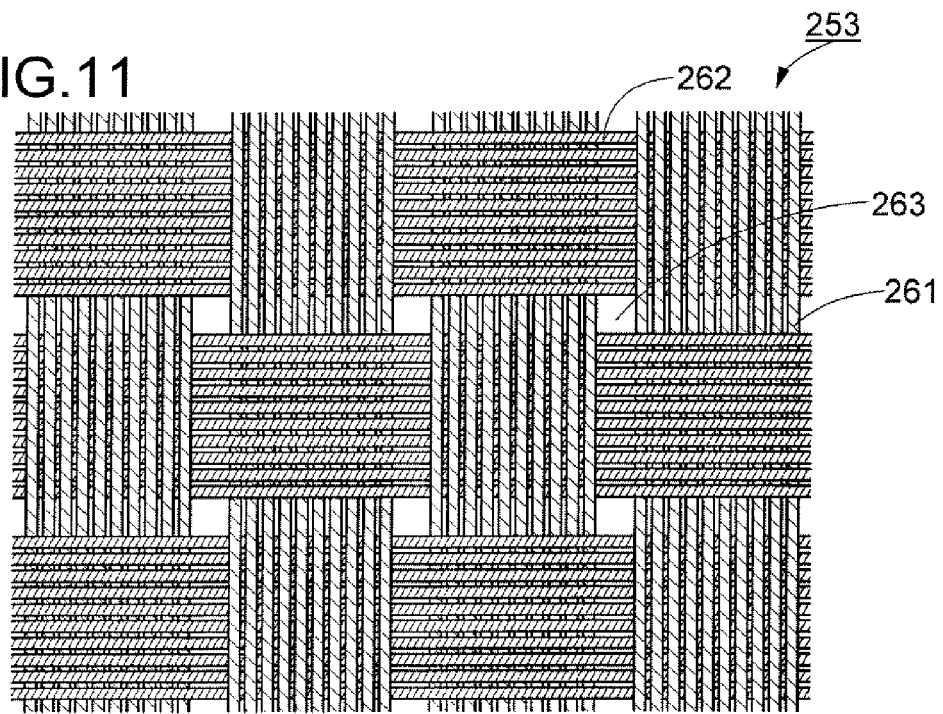
FIG. 11 is a plan view illustrating an example of the structure of the sheet fibrous body which is applied to the prepreg in FIG. 3A.

A woven fabric used for a sheet fibrous body is not limited to a plain-woven fabric. FIG. 11 illustrates an example of a structure of such a sheet fibrous body. FIG. 11 is a plan view of a sheet fibrous body 253. As illustrated in FIG. 11, the sheet fibrous body 253 is obtained by alternately weaving the ten warp yarns 261 and the ten weft yarns 262 so that they intersect with each other.

Further, to protect an electronic device with the use of a cured prepreg more effectively, the area of the basket hole 263 of each of the sheet fibrous bodies (251, 252, and 253) is preferably smaller than the area of a portion of the electronic device, which is locally pressed when the electronic device is used. For example, in the case where the electronic device is pressed with a tool having a sharp tip, like a writing implement such as a pen or a pencil, the shape of the basket hole 263 is preferably a quadrangle having sides each of which has a length of greater than or equal to 0.01 mm and less than or equal to 0.2 mm.

This embodiment can be combined with any of the other embodiments as appropriate.

Embodiment 6

In Embodiment 6, as an example, a structure of an electronic device which is capable of transmitting and receiving data through wireless communication and a method for manufacturing the electronic device will be described.

Figure 12:
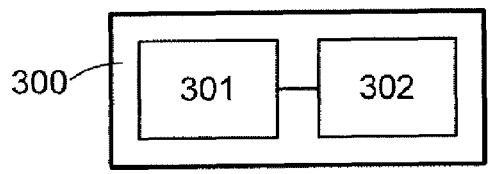
FIG. 12 is a block diagram illustrating of a structure an example an electronic device according to one embodiment of the present invention.

FIG. 12 is a block diagram illustrating an example of a structure of an electronic device 300 according to this embodiment. As illustrated in FIG. 12, the electronic device 300 includes an antenna 301 and a functional circuit 302 which includes a plurality of electronic elements. The antenna 301 transmits and receives carrier waves. For the antenna 301, the one with a structure suitable for a frequency band in which communication is performed is selected. The functional circuit 302 has at least a function of processing carrier waves which is received by the antenna 301 and/or a function of generating carrier waves which is transmitted from the antenna 301.

Carrier waves are a signal of alternating current waves which is also referred to as a carrier. In wireless communication, the frequency or amplitude of carrier waves is changed (modulated) in accordance with a signal representing data to generate modulated waves, and data is communicated through transmission and reception of the modulated waves. There are some kinds of methods for modulating carrier waves. A modulation method in which data is represented by the amplitude of carrier waves is called amplitude modulation. A modulation method in which data is represented by the frequency of carrier waves is called frequency modulation.

As a specific example of the electronic device 300, an IC chip (also referred to as a wireless chip) which can communicate data without contact is given. In addition, a radio frequency identification (RFID) tag with which individual identification without contact is performed is given. The RFID tag is also referred to as an RF tag, a wireless tag, an electronic tag, or an IC tag.

Figure 13:
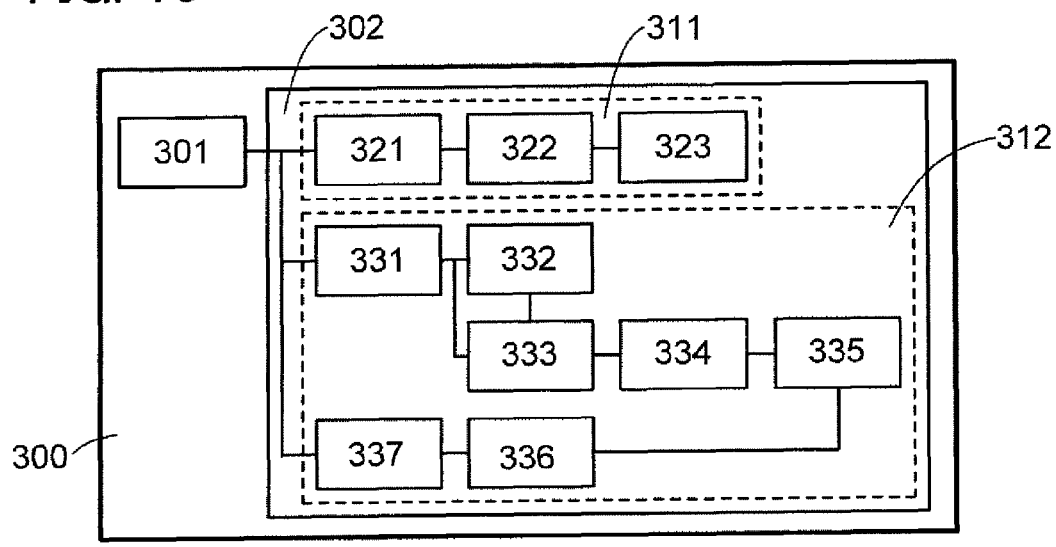
FIG. 13 is a block diagram illustrating a structure example of an electronic device according to one embodiment of the present invention.
Figure 14:
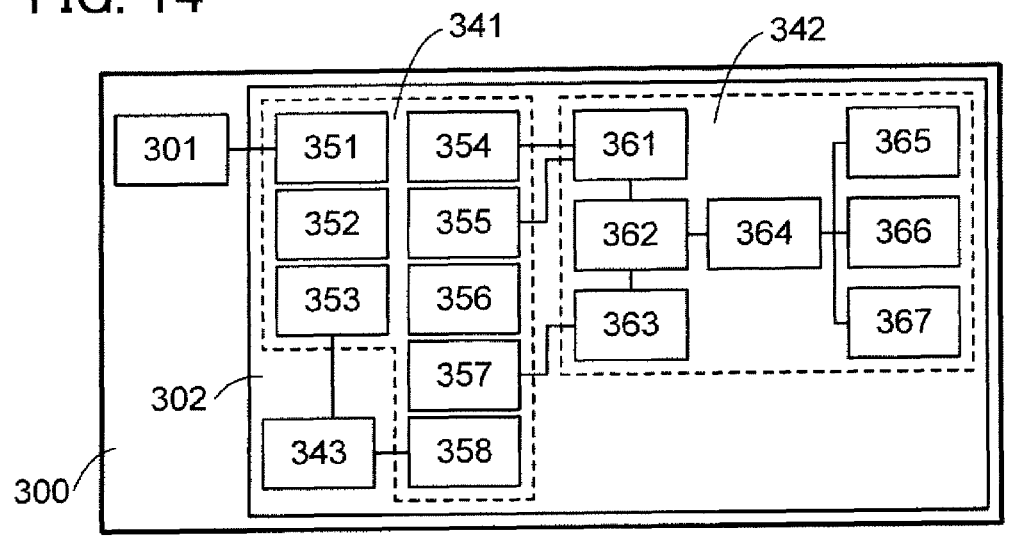
FIG. 14 is a block diagram illustrating a structure example of an electronic device according to one embodiment of the present invention.

An example of a structure of the electronic device 300 which can be used for an IC chip or an RFID tag will be described with reference to FIG. 13 and FIG. 14. FIG. 13 and FIG. 14 are each a block diagram illustrating an example of a structure of the electronic device 300.

First, the structure of the electronic device 300 in FIG. 13 will be described. In the electronic device 300 in FIG. 13, the functional circuit 302 can be divided into a power source portion 311 and a logic circuit portion 312 in terms of functions.

The power source portion 311 is a device for supplying power to the electronic device 300 and includes, for example, a rectifier circuit 321, a power storage portion 322, and a constant voltage circuit 323. The rectifier circuit 321 is a circuit to generate a direct-current voltage from a signal (carrier waves) received by the antenna 301. The power storage portion 322 is a circuit to store the direct-current voltage generated by the rectifier circuit 321 and thus includes, for example, a plurality of capacitors. The constant voltage circuit 323 is a circuit to make the voltage generated by the rectifier circuit 321 constant.

The logic circuit portion 312 has a function of extracting data from the signal (the carrier waves) received by the antenna 301, a function of generating carrier waves, which represents data transmitted from the antenna 301, and the like. For example, the logic circuit portion 312 includes a demodulation circuit 331, a clock generation/correction circuit 332, a code recognition/judgment circuit 333, a memory controller 334, a memory device 335, an encoding circuit 336, and a modulation circuit 337.

The demodulation circuit 331 is a circuit to demodulate the carrier waves received by the antenna 301. The clock generation/correction circuit 332 is a circuit to generate a clock signal based on the signal output from the demodulation circuit 331 and to correct the clock signal.

The code recognition/judgment circuit 333 recognizes a code included in the carrier waves received by the antenna 301 and makes a judgment. Further, the code recognition/judgment circuit 333 has a cyclic redundancy check (CRC) function, for discriminating a transmission error. As the code recognized by the code recognition/judgment circuit 333, an end-of-frame (EOF) signal, a start-of-frame (SOF) signal, a flag, a command code, a mask length, a mask value, and the like are given.

The memory controller 334 generates, on the basis of the code recognized by the code recognition/judgment circuit 333, a signal for reading out data from the memory device 335. The memory device 335 includes at least a read-only memory (ROM). Examples of the ROM include a mask ROM and a PROM. Further, the memory device 335 may include a memory circuit such as a random access memory (RAM), which is capable of rewriting data. As the memory circuit capable of rewriting data, for example, a DRAM, an SRAM, an FeRAM, an EEPROM, or a flash memory can be used.

The encoding circuit 336 encodes data which is to be transmitted from the electronic device 300, such as data read out from the memory device 335, or the like. The modulation circuit 337 modulates the signal based on the data which has been encoded in the encode circuit 336 to generate carrier waves which can be transmitted from the antenna 301.

Next, the structure of the electronic device 300 in FIG. 14 will be described. The electronic device 300 functions as an arithmetic processing unit which operates through wireless communication with an external device. In the electronic device 300 in FIG. 14, the functional circuit 302 can be divided into an analog circuit portion 341, a digital circuit portion 342, and a power storage portion 343 in terms of functions.

The analog circuit portion 341 includes a resonance circuit 351 having a resonant capacitor, a constant voltage circuit 352, a rectifier circuit 353, a demodulation circuit 354, a modulation circuit 355, a reset circuit 356, an oscillator circuit 357, and a power supply control circuit 358.

The digital circuit portion 342 includes an RF interface 361, a control register 362, a clock controller 363, a central processing unit (CPU) 364, a CPU interface 365, an RAM 366, and an ROM 367.

The operation of the electronic device 300 in FIG. 14 is roughly described below. A signal (carrier waves) received by the antenna 301 is input to the analog circuit portion 341 and an induced electromotive force is generated in the resonance circuit 351. The induced electromotive force is stored in the power storage portion 343 via the rectifier circuit 353. The power storage portion 343 can be formed using a capacitor such as a ceramic capacitor or an electric double layer capacitor.

The reset circuit 356 generates a signal which resets and initializes the digital circuit portion 342. For example, the reset circuit 356 generates a signal which rises after increase in a power supply voltage with delay as a reset signal. The oscillator circuit 357 changes the frequency and the duty ratio of a clock signal in accordance with a control signal generated by the constant voltage circuit 352. The demodulation circuit 354 is a circuit which demodulates a received signal, and the modulation circuit 355 is a circuit which modulates a signal so that data to be transmitted is included in carrier waves.

For example, when a modulation method by which a signal is processed in the electronic device 300 is an amplitude shift keying (ASK) method, which is one of amplitude modulation methods, the demodulation circuit 354 is preferably formed using a low-pass filter. The demodulation circuit 354 binarizes the received signal based on variation in amplitude. On the other hand, the modulation circuit 355 changes the resonance point of the resonance circuit 351, thereby changing the amplitude of the signal.

The clock controller 363 generates a control signal for changing the frequency and the duty ratio of a clock signal in accordance with a power supply voltage or a current consumed in the CPU 364. The power supply voltage is monitored by the power supply control circuit 358.

The signal received by the antenna 301 is demodulated by the demodulation circuit 354. The demodulated signal is decomposed into a control command, data, and the like by the RF interface 361. The control command is stored in the control register 362. The control command includes an instruction to a circuit included in the digital circuit portion 342, such as an instruction for reading out data from the ROM 367, an instruction for writing data to the RAM 366, or an arithmetic instruction to the CPU 364.

The CPU 364 accesses the ROM 367, the RAM 366, and the control register 362 via the CPU interface 365. The CPU interface 365 generates an access signal which allows the CPU 364 to access any of the ROM 367, the RAM 366, and the control register 362 in accordance with an address requested by the CPU 364.

There are several arithmetic processing methods of the CPU 364, and a method in which processing is performed by software is one of the methods. In this method, for example, the ROM 367 stores an operating system (OS) and the CPU 364 reads out a program stored in the ROM 367 to execute. Another method is a method in which processing is conducted by a dedicated arithmetic circuit, that is, a method in which processing is conducted by hardware. Another method is a method in which hardware and software are used. In this method, part of arithmetic processing is conducted by a dedicated arithmetic circuit and the other part of the arithmetic processing is conducted by the CPU 364 with the use of a program.

Next, a method for manufacturing the electronic device 300 in this embodiment will be described. This manufacturing method includes a step of separation of a substrate which is used for manufacturing an electronic element included in the functional circuit 302.

For example, in the manufacturing method described in Embodiment 1, a separation film (e.g., a film including silicon) is formed between the substrate 100 and the insulating film 101 serving as a base and removed by etching, so that the electronic device can be separated from the substrate 100. Alternatively, the electronic device can be separated from the substrate 100 in such a manner that a separation film which includes metal as its main component is formed between the substrate 100 and the insulating film 101 serving as a base and physical force is applied to the separation film in order to cause separation along the separation film. An example of the method for manufacturing the electronic device 300, to which the latter method is applied, will be described below with reference to FIGS. 15A to 15D, FIGS. 16A to 16D, FIGS. 17A to 17C, FIGS. 18A and 18B, FIGS. 19A and 19B, and FIG. 20A.

First, as illustrated in FIG. 15A, a substrate for manufacturing an electronic element of the functional circuit 302 is prepared. Here, as the substrate, a glass substrate 400 is used. The functional circuit 302 is formed over a base insulating film 401 which is formed over the glass substrate 400. A separation film 402 is formed between the base insulating film 401 and the glass substrate 400 so that the functional circuit 302 is separated from the glass substrate 400 after the functional circuit 302 is manufactured.

Before the separation film 402 is formed, a base film 403 is formed on and in close contact with the glass substrate 400. The base film 403 is a base film of the separation film 402 and is formed in order to improve adhesion between the separation film 402 and the glass substrate 400. The base film 403 can be formed using an insulating film with a single-layer structure or a layered structure. As the insulating film used to form the base film 403, a silicon oxide film, a silicon oxynitride film, a silicon nitride oxide film, a silicon nitride film, a metal oxide film, or the like can be used. Here, a silicon oxynitride film with a thickness of 100 nm is formed with a PECVD method.

Next, the separation film 402 is formed to be in contact with the base film 403. Here, as the separation film 402, a tungsten film with a thickness of 50 nm is formed with a sputtering method.

In this manufacturing method, separation is caused preferentially inside the separation film 402 and/or at the interface between the separation film 402 and the base insulating film 401 by applying mechanical force to the separation film 402 so that the functional circuit 302 is separated from the glass substrate 400. In order that such separation may be caused, the separation film 402 is formed using a tungsten film, a molybdenum film, an alloy film of tungsten and molybdenum, an oxide film of tungsten and/or molybdenum, an oxynitride film of tungsten and/or molybdenum, a nitride oxide film of tungsten and/or molybdenum, or a nitride film of tungsten and/or molybdenum, for example. Further, the separation film 402 can be formed using a stack of films selected from the above. These films can be formed with a sputtering method, a PECVD method, a droplet discharging method, or the like.

The separation film 402 may be formed in such a manner that a tungsten film, a molybdenum film, or an alloy film of tungsten and molybdenum is formed as a first layer and an oxide film, an oxynitride film, a nitride oxide film, or a nitride film of the first layer is formed as a second layer. Alternatively, the separation film 402 may be formed in such a manner that a tungsten film, a molybdenum film, or an alloy film of tungsten and molybdenum is formed over the base film 403 and the film is subjected to oxidation treatment. As the oxidation treatment, thermal oxidation treatment, plasma oxidation treatment with $O_2$ or $N_2O$ plasma, surface treatment with a solution having strong oxidizing power, such as ozone water, or the like can be used.

Next, the base insulating film 401 with a single-layer structure or a stacked-layer structure is formed to be in contact with the separation film 402. An insulating film which can endure later steps of manufacturing the electronic device 300 is selected as the base insulating film 401 and can be formed in a manner similar to that of the insulating film 101 in FIG. 1A. Here, the base insulating film 401 has a three-layer structure; a silicon oxynitride film with a thickness of 100 nm to 700 nm is formed as a first layer, a silicon nitride oxide film with a thickness of 20 nm to 100 nm is formed as a second layer, and a silicon oxynitride film with a thickness of 50 nm to 150 nm is formed as a third layer. These films are formed by a PECVD method.

Next, the functional circuit 302 is manufactured over the base insulating film 401. A plurality of functional circuits 302 is simultaneously manufactured over the glass substrate 400 in the same process. A process of manufacturing two functional circuits 302 each including an n-channel transistor and a p-channel transistor is illustrated in drawings.

As illustrated in FIG. 15B, a semiconductor film 405 is formed over the base insulating film 401 in order to manufacture the functional circuits 302. Here, a crystalline silicon film is formed as the semiconductor film 405. For example, the crystalline silicon film can be formed in such a manner that an amorphous silicon film with a thickness of 40 nm to 80 nm is formed with a PECVD method using a mixed gas of $H_2$ and $SiH_4$ and then the amorphous silicon film is crystallized by irradiation with a second harmonic of an Nd:YVO$_4$ laser (a fundamental wave of 1064 nm). Alternatively, the amorphous silicon film may be crystallized with thermal treatment in a heating furnace.

Next, a resist mask is formed over the semiconductor film 405 and the semiconductor film 405 is etched to have a desired shape using the resist mask, so that semiconductor films 420 and semiconductor films 430 are formed over the base insulating film 401 as illustrated in FIG. 15C. The semiconductor films 420 are semiconductor layers of the n-channel transistors and the semiconductor films 430 are semiconductor layers of the p-channel transistors. After the resist mask used to etch the semiconductor film 405 is removed, if needed, an impurity element serving as a donor or acceptor is added to the semiconductor films 420 and/or the semiconductor films 430 in order to control the threshold voltage of the transistors. Alternatively, the step of adding an impurity element may be performed before the semiconductor film 405 is etched and may be performed as necessary in a later step.

Next, as illustrated in FIG. 15C, an insulating film 406 is formed so as to cover the semiconductor films 420 and the semiconductor films 430. The insulating film 406 serves as a gate insulating film of each of the transistors. The insulating film 406 can be formed in a manner similar to that of the insulating film 102 in FIG. 2A. Here, a silicon oxynitride film with a thickness of 10 nm to 100 nm is formed with a PECVD method. Further, after an insulating film is formed with a PECVD method or the like, the insulating film may be subjected to nitriding treatment with microwave-exited high-density plasma.

Next, as illustrated in FIG. 15C, conductors 441 and conductors 442 are formed over the insulating film 406. The conductors 441 form gate electrodes (or gate wirings) of the n-channel transistors and the conductors 442 form gate electrodes (or gate wirings) of the p-channel transistors. Here, each of the conductors 441 and 442 are formed to have a two-layer structure. First, a tantalum nitride film with a thickness of 20 nm to 50 nm is formed over the insulating film 406 with a sputtering method and then a tungsten film with a thickness of 100 nm to 300 nm is formed over the tantalum nitride film with a sputtering method. Next, a resist mask is formed over the tungsten film. The stack of the tantalum nitride film and the tungsten film is etched with the use of the resist mask, so that the conductors 441 and 442 are formed.

Next, as illustrated in FIG. 15D, n-type low-concentration impurity regions 423 are formed in the semiconductor films 420 and p-type high-concentration impurity regions 432 are formed in the semiconductor films 430. The n-type low-concentration impurity regions 423 form high-resistance regions of the n-channel transistors and the p-type high-concentration impurity regions 432 function as source and drain regions of the p-channel transistors.

In order to form these regions, first, resist masks which cover the semiconductor films 430 are formed. An impurity element which imparts n-type conductivity is added to the semiconductor films 420 with the use of the conductors 441 as masks, so that the n-type low-concentration impurity regions 423 are formed in the semiconductor films 420. Regions in the semiconductor films 420, where the impurity element is not added in this step, become channel formation regions 421. Then, after the resist masks which cover the semiconductor films 430 are removed, resist masks which cover the semiconductor films 420 are formed. An impurity element which imparts p-type conductivity is added to the semiconductor films 430 with the use of the conductors 440 as masks, so that the p-type high-concentration impurity regions 432 are formed in the semiconductor films 430. Then, the resist masks are removed. Regions in the semiconductor films 430, where the impurity element is not added in the step of adding the impurity element, become channel formation regions 431.

As for the steps illustrated in FIG. 15C, the p-type high-concentration impurity regions 432 may be formed first and then the n-type low-concentration impurity regions 423 may be formed.

In this embodiment, phosphorus (P), arsenic (As), or the like can be used as the impurity element which imparts n-type conductivity, and boron (B), aluminum (Al), gallium (Ga), or the like can be used as the impurity element which imparts p-type conductivity.

Next, as illustrated in FIG. 16A, an insulating film 407 is formed so as to cover the insulating film 406, the conductors 441, and the conductors 442. The insulating film 407 can be formed in a manner similar to that of the insulating film 103 in FIG. 1A. Here, the insulating film 407 is formed to have a two-layer structure; a silicon oxide film with a thickness of 50 nm to 150 nm is formed as a first layer with a PECVD method, and a low temperature oxide (LTO) film with a thickness of 100 nm to 250 nm is formed as a second layer with a thermal CVD method which is performed at a process temperature of 200° C. to 500° C.

Next, the insulating film 407 and the insulating film 406 are subjected to etching. This etching step is performed by anisotropic etching mainly in a perpendicular direction. By such anisotropic etching, sidewalls formed using the insulating film 407 can be formed on side surfaces of the conductors 441 and the conductors 442 as illustrated in FIG. 16B. Further, regions of the insulating film 406, which are covered with the conductors 441, the conductors 442, and the insulating films 407, are left in this etching step and the other regions of the insulating film 406 are removed.

Next, as illustrated in FIG. 16C, n-type high-concentration impurity regions 422 serving as source and drain regions are formed in the semiconductor films 420. First, resist masks which cover the semiconductor films 430 are formed, and then an impurity element which imparts n-type conductivity is added to the semiconductor films 420. In this step of adding the impurity element, the conductors 441 and the insulating films 407 serve as masks, the n-type high-concentration impurity regions 422 are formed in the semiconductor films 420 in a self-aligned manner, and the n-type low-concentration impurity regions 423 formed in the step illustrated in FIG. 15D are left in portions overlapping with the insulating films 407.

Next, an insulating film 408 is formed so as to cover the semiconductor films 420, the semiconductor films 430, the conductors 441, and the conductors 442. Then, conductors 443 to 445 are formed over the insulating film 408.

The insulating film 408 can be formed in a manner similar to that of the insulating film 103 in FIG. 1A. Here, the insulating film 408 is formed to have a three-layer structure. First, as a first layer, a silicon oxynitride film with a thickness of 20 nm to 100 nm is formed with a PECVD method. After that, heat treatment is performed to activate the impurity elements added to the semiconductor films 420 and the semiconductor films 430. Then, as a second layer, a silicon nitride oxide film with a thickness of 100 nm to 300 nm is formed with a PECVD method, and as a third layer, a silicon oxynitride film with a thickness of 200 nm to 1 μm is formed with a PECVD method.

Next, in order that the conductors 443 and the conductors 444 are electrically connected to the n-type high-concentration impurity regions 422 and the p-type high-concentration impurity regions 432, respectively, the insulating film 408 is etched so that openings are formed. Then, a conductive film to be the conductors 443 to 445 is formed over the insulating film 408. The conductive film can be formed in a manner similar to that of the conductor 113 in FIG. 1A. Here, as the conductive film, a conductive film with three layers is formed with a sputtering method. A first layer is a titanium film with a thickness of 50 nm to 150 nm, a second layer is a pure aluminum film with a thickness of 200 nm to 400 nm, and a third layer is a titanium film which is the same as the first layer. Then, a resist mask is formed over the conductive film with a three-layer structure and the conductive film is etched using the resist mask, so that the conductors 443 to 445 are formed.

The conductors 443 are electrically connected to the n-type high-concentration impurity regions 422 and each of them functions as a source electrode, a source wiring, a drain electrode, or a drain wiring of the n-channel transistor. The conductors 444 are electrically connected to the p-type high-concentration impurity regions 432 and each of them functions as a source electrode, a source wiring, a drain electrode, or a drain wiring of the p-channel transistor. Further, the conductor 445 forms a portion in which the functional circuit 302 and the antenna 301 are electrically connected to each other.

Through the above steps, electronic elements (n-channel transistors 491 and p-channel transistors 492) of the functional circuits 302 are completed. Next, an example of steps of forming a connection terminal of the functional circuit 302 and the antenna 301 is described with reference to FIGS. 17A to 17C and FIGS. 18A and 18B. In this embodiment, a connection terminal is manufactured by the method described in Embodiment 1.

As illustrated in FIG. 17A, an insulating film 409 is formed so as to cover the conductors 443 to 445. Here, the insulating film 409 is formed to have a two-layer structure. A dense insulating film is formed as a first layer in order to protect the electronic elements of the functional circuits 302. Here, a silicon nitride film with a thickness of 50 nm to 200 nm is formed as the first layer by a PECVD method. As a second layer, a resin film (e.g., a polyimide film) with a thickness of 1 μm to 3 μm is formed using a photosensitive resin material in order to flatten an upper surface of the functional circuit 302. Openings are formed in portions of the resin film, which correspond to the conductors 445, with exposure treatment. Then, the silicon nitride film formed as the first layer is subjected to etching so that portions overlapping with the openings in the resin film are removed.

Next, a conductor 446 which is electrically connected to the conductors 445 is formed over the insulating film 409. Here, a titanium film with a thickness of 100 nm to 300 nm is formed by a sputtering method and etched to have the predetermined shape so that the conductor 446 is formed.

A prepreg 460 which includes an uncured matrix resin 462 including a reinforcing material 461 is prepared. The matrix resin 462 is heated to be cured. A prepreg which is similar to the prepreg 130 in FIG. 1D can be used as the prepreg 460. The prepreg 460 preferably has a thickness of 10 μm to 100 μm when it is cured. This is to protect the functional circuit 302 and to give flexibility to the functional circuit 302 with the cured prepreg 460.

The prepreg 460 has a plurality of openings 463 in a region which overlaps with the conductor 446, like the prepreg 212 illustrated in FIG. 8B. As in the step of forming the openings 133 illustrated in FIG. 2B, the openings 463 can be formed by laser beam treatment, punching treatment, drill treatment, or the like. The method for forming the openings 463 can be determined by a practitioner in consideration of the number, the size, the shape, the layout, and the like of the openings 463. The number, the size, the shape, the layout, and the like of the openings 463 are determined in consideration of characteristics (e.g., a resistance value) which are needed for a circuit layout and a circuit design.

Then, the prepreg 460 is attached to the insulating film 409 so that the openings 463 overlap with the conductor 446 as illustrated in FIG. 17A.

Next, as illustrated in FIG. 17B, a conductive paste 450 is provided in a region of the prepreg 460, which overlaps with the conductor 446. The conductive paste 450 can be formed in a manner similar to that of the conductor 141 in FIG. 1C. Here, the prepreg 460 is coated with a silver paste by a screen printing method. The conductive paste 450 flows into the openings 463 to be in contact with the conductor 446.

Next, the conductive paste 450 and the prepreg 460 are cured. With a vacuum heat press, the conductive paste 450 and the prepreg 460 are heated while the prepreg 460 is pressed so that the conductive paste 450 and the prepreg 460 are cured. As illustrated in FIG. 17C, an insulating film 410 (a resin film) including the reinforcing material 461 is formed from the prepreg 460 which has been cured. The insulating film 410 functions as a sealing film of the functional circuit 302. In the insulating film 410, a resin 464 corresponds to the matrix resin 462 which has been cured. A conductor 451 which is included in a terminal portion 455 is formed from the cured conductive paste 450. The conductor 451 penetrates the insulating film 410 and is in close contact with the conductor 446.

Trough the above steps, the terminal portion 455 of the functional circuit 302 is completed. The terminal portion 455 is a connection portion which is electrically connected to the antenna 301. The terminal portion 455 includes the conductor 445, the conductor 446, and the conductor 451.

In this embodiment, the functional circuit 302 is not damaged by a laser beam in the process of manufacturing the terminal portion 455, whereby miniaturization and high performance of the electronic elements of the functional circuit 302 are easily achieved. Thus, a high performance circuit such as the functional circuit 302 including the CPU 364 illustrated in FIG. 14 can be manufactured with a high yield.

Next, a step of separating the functional circuits 302 from the glass substrate 400 is performed. This separation step can be performed as follows, for example.

First, irradiation with a UV laser beam is performed from an insulating film 410 side so that a groove (not illustrated) is formed in a stack over the glass substrate 400 so as to reach the separation film 402. By formation of the groove, separation is caused inside the separation film 402 and/or at the interface between the base insulating film 401 and the separation film 402. Accordingly, the plurality of functional circuits 302 can be separated from the glass substrate 400 with relatively weak force (force that can be applied by a hand). Next, as illustrated in FIG. 18A, a heat separation-type adhesive film 470 (hereinafter referred to as the "film 470") which is formed using a resin film such as a polyethylene terephthalate (PET) film is attached to the insulating film 410.

Then, as illustrated in FIG. 18B, the stack over the base insulating film 401 is separated from the glass substrate 400. This separation step can be performed using, for example, a separating apparatus provided with a winding roller. Alternatively, the separation step can be performed by a hand or by pulling of the film 470 with a pair of tweezers, or the like.

Next, in order to protect the portion which is exposed due to removal of the glass substrate 400, a protective film which is formed using a prepreg including a reinforcing material is formed. For formation of the protective film, the one which is similar to the prepreg 460 used for forming the insulating film 410 can be used. The prepreg 460 which has not been cured is attached to the base insulating film 401, and the prepreg 460 is cured by a vacuum heat press with the prepreg 460 closely attached to the base insulating film 401. As a result, as illustrated in FIG. 19A, an insulating film 411 including a reinforcing material 461 is formed on the base insulating film 401 side. The insulating film 411 is a resin film and also functions as a sealing film of the functional circuit 302.

Next, the stack held by the film 470 is divided into the individual functional circuit 302. This step can be performed by dicing, scribing, or the like. Here, scribing with the use of a UV laser beam is performed. Irradiation with a UV laser beam is performed from the insulating film 411 side, so that a groove is formed in the stack held by the film 470. As illustrated in FIG. 19B, by forming the groove, the plurality of functional circuits 302 held by the film 470 is formed. In order to separate the functional circuits 302 from the film 470, the film 470 may be heated so that adhesiveness of the film 470 is decreased.

Next, the antenna 301 is electrically connected to the functional circuit 302. Here, as the antenna 301, a film antenna including a film 500 formed using a resin such as polyester and a conductor 501 formed over the film 500 is used. As the film 500, a film which has flexibility and is formed using an insulating material is preferably used. Since the functional circuit 302 has a structure in which the electronic elements are sealed with the insulating film 410 and the insulating film 411 each of which is formed using a resin, the functional circuit 302 is flexible and bendable. Therefore, when the antenna 301 is formed using a film antenna which is bendable, the electronic device 300 can also be flexible.

For example, as the film 500, a resin film such as a polyester film, a polycarbonate film, an acrylic film, or a polyimide film can be used. The conductor 501 includes a portion forming a main body of the antenna and a terminal portion which is electrically connected to the functional circuit 302. A surface of the conductor 501 is covered with a layer formed using an insulating material such as a resin, except for the terminal portion.

As illustrated in FIG. 20A, the conductor 501 of the antenna 301 and the terminal portion 455 of the functional circuit 302 are electrically connected to each other. Here, the conductor 501 and the conductor 451 are electrically connected to each other using a conductor 510 formed of a conductive paste. A means for connecting the conductor 501 and the conductor 451 in the terminal portion 455 is not limited to the conductive paste. A practitioner can select the means as appropriate in consideration of structures (e.g., shapes, materials, and manufacturing methods) of the conductor 501 and the conductor 451. For example, it is possible to form the conductor 510 using an anisotropic conductive film or solder paste.

The conductor 501 may have a suitable structure (e.g., a shape, a size) in accordance with the frequency band of carrier waves transmitted and received by the electronic device 300, the communication distance, or the like. Three examples of the structure of the antenna 301 (the conductor 501) are described with reference to FIGS. 20B to 20D.

For example, when the frequency band is from the 125 kHz band to the 135 kHz band or the 13.56 MHz band, a loop antenna, a coil antenna, or a spiral antenna may be used as the antenna 301. FIG. 20B illustrates a plan view of the electronic device 300 in which a loop antenna is applied to the antenna 301. In addition, FIGS. 20C and 20D illustrate a structural example of the electronic device 300 used in the UHF band (860 to 960 MHz band) and a structural example of the electronic device 300 used in the 2.45 GHz band, respectively. The antenna 301 of the electronic device 300 in FIG. 20C is a dipole antenna and the antenna 301 of the electronic device 300 in FIG. 20D is a patch antenna.

In addition, the electronic device 300 of this embodiment may be embedded in paper or interposed between two plastic substrates, whereby an IC card can be manufactured. Further, the electronic device 300 in FIGS. 20B to 20D is embedded in paper, and bills, securities, bearer bonds, and certificates can be formed using the paper. The electronic device 300 is embedded, whereby the certificates and the like can each have an authentication function and an effect of preventing forgery can be obtained.

Further, the electronic device 300 may be used by being fixed to a variety of goods and objects. As a method for fixing the electronic device 300 to the goods and objects, there are methods such as embedding the electronic device 300 in the goods and objects, and attaching the electronic device 300 to the surface of the goods and objects. Since the electronic device 300 of this embodiment has flexibility, the appearance of an object to which the electronic device 300 is attached is unlikely to be spoiled, and the electronic device 300 can be fixed to a curved surface. Further, as the goods and objects to which the electronic device 300 is fixed, for example, the following is given: packaging containers (such as wrapping paper and bottles), recording media (such as Blu-ray Discs, DVDs, and USB memories), clothing and accessories (such as bags, glasses, and clothing), foods, plants, animals (such as livestock and pets), commodities, and shipping tags and labels on products and baggage. When the electronic device 300 is fixed to these goods and objects, inspection, distribution management, historical management of the objects, and the like are easily systematized.

For example, when the electronic device 300 is fixed to a shipping tag or a price tag of a product and data stored in the electronic device 300 is read with a reader/writer which is provided beside a conveyor belt, data on a manufacturing process, a distribution process, a delivery destination, and the like is obtained and thus product inspection and stock management can be performed with high efficiency.

This embodiment can be combined with any of the other embodiments as appropriate.

This application is based on Japanese Patent Application serial no. 2009-241992 filed with Japan Patent Office on Oct. 21, 2009, the entire contents of which are hereby incorporated by reference.

What is claimed is:

1. A method for manufacturing an electronic device, comprising the steps of:
   forming a first conductor over a first insulating film;
   providing a conductive paste on the first conductor;
   disposing a prepreg having at least one opening over the first insulating film so that the at least one opening overlaps with the conductive paste provided over the first conductor; and
   curing the conductive paste and the prepreg by heat treatment, thereby forming a second conductor and a second insulating film,
   wherein the first conductor is electrically connected to an electronic element.

2. The method for manufacturing an electronic device according to claim 1, further comprising a step of forming the at least one opening in a region of the prepreg before disposing the prepreg over the first insulating film,
  wherein the region overlaps with the first conductor when the prepreg is disposed over the first insulating film.

3. The method for manufacturing an electronic device according to claim 1, further comprising a step of forming the first insulating film which covers the electronic element.

4. The method for manufacturing an electronic device according to claim 1, wherein a resin contained in the prepreg has a fluidity.

5. The method for manufacturing an electronic device according to claim 1, wherein the prepreg comprises a resin and a sheet fibrous body.

6. The method for manufacturing an electronic device according to claim 5, wherein the sheet fibrous body functions as a reinforcing material.

7. The method for manufacturing an electronic device according to claim 5, wherein the sheet fibrous body comprises glass fiber.

8. The method for manufacturing an electronic device according to claim 1, further comprising a step of forming a third conductor electrically connected to the second conductor.

9. The method for manufacturing an electronic device according to claim 1, further comprising a step of electrically connecting an antenna to the second conductor.

10. The method for manufacturing an electronic device according claim 1, further comprising the steps of:
  forming the electronic element over a substrate with a separation film and a third insulating film provided therebetween before forming the first conductor electrically connected to the electronic element;
  separating the substrate from the electronic element at the separation film after forming the second conductor and the second insulating film;
  disposing a second prepreg in a portion which is exposed by separation of the substrate; and
  curing the second prepreg so that a fourth insulating film is formed.

11. A method for manufacturing an electronic device, comprising the steps of:
  forming a first conductor over a first insulating film;
  providing a conductive paste in at least one opening in a prepreg;
  disposing the prepreg over the first conductor and the first insulating film so that the at least one opening provided with the conductive paste overlaps with the first conductor; and
  curing the conductive paste and the prepreg by heat treatment, thereby forming a second conductor and a second insulating film,
  wherein the first conductor is electrically connected to an electronic element.

12. The method for manufacturing an electronic device according to claim 11, further comprising a step of forming the at least one opening in a region of the prepreg before disposing the prepreg over the first insulating film,
  wherein the region overlaps with the first conductor when the prepreg is disposed over the first insulating film.

13. The method for manufacturing an electronic device according to claim 11, further comprising a step of forming the first insulating film which covers the electronic element.

14. The method for manufacturing an electronic device according to claim 11, wherein a resin contained in the prepreg has a fluidity.

15. The method for manufacturing an electronic device according to claim 11, wherein the prepreg comprises a resin and a sheet fibrous body.

16. The method for manufacturing an electronic device according to claim 15, wherein the sheet fibrous body functions as a reinforcing material.

17. The method for manufacturing an electronic device according to claim 15, wherein the sheet fibrous body comprises glass fiber.

18. The method for manufacturing an electronic device according to claim 11, further comprising a step of forming a third conductor electrically connected to the second conductor.

19. The method for manufacturing an electronic device according to claim 11, further comprising a step of electrically connecting an antenna to the second conductor.

20. The method for manufacturing an electronic device according claim 11, further comprising the steps of:
  forming the electronic element over a substrate with a separation film and a third insulating film provided therebetween before forming the first conductor electrically connected to the electronic element;
  separating the substrate from the electronic element at the separation film after forming the second conductor and the second insulating film;
  disposing a second prepreg in a portion which is exposed by separation of the substrate; and
  curing the second prepreg so that a fourth insulating film is formed.

21. A terminal structure comprising:
  a first conductor;
  a resin film comprising a sheet fibrous body and covering the first conductor; and
  a second conductor,
  wherein the resin film comprises a first opening,
  wherein the sheet fibrous body comprises a second opening and a third opening,
  wherein the second conductor is electrically connected to the first conductor through the first opening and the second opening, and
  wherein the third opening does not overlap with the second conductor.

22. The terminal structure according to claim 21, wherein the sheet fibrous body functions as a reinforcing material.

23. The terminal structure according to claim 21, wherein the sheet fibrous body comprises glass fiber.

24. The terminal structure according to claim 21, further comprising a third conductor electrically connected to the second conductor.

25. The terminal structure according to claim 21, wherein a resin of the resin film is provided in the third opening in the sheet fibrous body.

26. An electronic device comprising:
  at least one electronic element;
  a first conductor electrically connected to the at least one electronic element;
  a first resin film comprising a sheet fibrous body and covering the at least one electronic element and the first conductor,
  wherein the first resin film comprises a first opening,
  wherein the sheet fibrous body comprises a second opening and a third opening,
  a second conductor over the first resin film,
  wherein the second conductor is electrically connected to the first conductor through the first opening and the second opening, and wherein the third opening does not overlap with the second conductor.

27. The electronic device according to claim 26, further comprising a second resin film including a second sheet fibrous body,
   wherein the at least one electronic element is sandwiched between the first resin film and the second resin film.

28. The electronic device according to claim 26,
   wherein the sheet fibrous body functions as a reinforcing material.

29. The electronic device according to claim 26, wherein the sheet fibrous body comprises glass fiber.

30. The electronic device according to claim 26, further comprising a third conductor electrically connected to the second conductor.

31. The electronic device according to claim 26, further comprising an antenna electrically connected to the second conductor.

32. The electronic device according to claim 26, wherein a resin of the first resin film is provided in the third opening in the sheet fibrous body.

* * * * *